(12) United States Patent
Steeneken et al.

(10) Patent No.: US 7,898,148 B2
(45) Date of Patent: Mar. 1, 2011

(54) OSCILLATOR BASED ON PIEZORESISTIVE RESONATORS

(75) Inventors: Peter Gerard Steeneken, Valkenswaard (NL); Jozef Thomas Martinus Van Beek, Rosmalen (NL)

(73) Assignee: NXP B.V., Eindhoven (NL)

(*) Notice: Subject to any disclaimer, the term of this patent is extended or adjusted under 35 U.S.C. 154(b) by 219 days.

(21) Appl. No.: 12/159,769

(22) PCT Filed: Sep. 8, 2006

(86) PCT No.: PCT/IB2006/053185
§ 371 (c)(1),
(2), (4) Date: Jul. 16, 2008

(87) PCT Pub. No.: WO2007/036820
PCT Pub. Date: Apr. 5, 2007

(65) Prior Publication Data
US 2009/0026882 A1    Jan. 29, 2009

(30) Foreign Application Priority Data
Sep. 30, 2005 (EP) .................. 05109061
Aug. 9, 2006 (EP) .................. 06118661

(51) Int. Cl.
*H01L 41/09* (2006.01)

(52) U.S. Cl. .............. 310/317; 310/311; 310/318
(58) Field of Classification Search .......... 310/318, 310/317
See application file for complete search history.

(56) References Cited

U.S. PATENT DOCUMENTS

| | | | | |
|---|---|---|---|---|
| 4,967,138 A | * | 10/1990 | Obergfell et al. | 323/224 |
| 6,208,534 B1 | * | 3/2001 | Shteynberg et al. | 363/21.04 |
| 6,680,603 B1 | * | 1/2004 | Klaus-Manfred | 323/266 |
| 2005/0257616 A1 | * | 11/2005 | Kozlov et al. | 73/514.16 |
| 2008/0231385 A1 | * | 9/2008 | Van Beek | 331/155 |

FOREIGN PATENT DOCUMENTS

| | | |
|---|---|---|
| GB | 1207521 A | 10/1970 |
| WO | WO2004053431 A | 6/2004 |

* cited by examiner

*Primary Examiner*—Walter Benson
*Assistant Examiner*—Bryan P Gordon

(57) ABSTRACT

An oscillator circuit is described comprising a piezoresistive resonator and a phase changing devices. Oscillator circuits with piezoresistive resonators do have the advantage that they can perform self-sustaining oscillation without additional active devices as e.g. transistors since they can be used as amplifiers. Phase changing devices as capacitors, coils and further piezoresistive resonator are used in order to compensate the $\pi/2$ phase shift of the piezoresistive resonator.

10 Claims, 16 Drawing Sheets

OSCILLATOR BASED ON PIEZORESISTIVE RESONATORS

The current invention is related to oscillators, oscillator circuits comprising piezoresistive resonators and to MEMS structures having such circuits as well as to methods of manufacturing and operating them.

Certain crystals, most notably quartz, exhibit piezoelectricity, meaning that if force is applied to a crystal's face, the crystal generates a voltage. Conversely, if an electrical voltage is applied to a crystal, it causes the crystal to mechanically deform. It is known to use this to make an oscillator. A crystal is placed into the feedback path of an amplifier circuit, so that it begins to oscillate at a frequency dependent primarily on the crystal's dimensions. This is a parallel resonant circuit, the crystal is placed in a parallel path around an amplifier or inverter.

It is also known to make sensors using MEMS (micro electro mechanical systems) techniques, based on the property of piezoresistivity. The sensing material in a piezoresistive pressure sensor is a diaphragm formed in a silicon substrate, which bends with applied pressure. A deformation occurs in the crystal lattice of the diaphragm because of that bending. This deformation causes a change in the band structure of the piezoresistors that are placed on the diaphragm, leading to a change in the resistivity of the material. This change can be an increase or a decrease according to the type of dopant of the resistors.

However, such piezoresistive resonating elements are not often used for oscillators as the conventional feedback arrangement is not effective because there is a $\pi/2$ phase shift in the output of the piezoresistive element.

It's an objective of the current invention to provide an improved oscillator circuit comprising a piezoresistive resonator. The objective is achieved by means of an oscillator circuit comprising at least one piezoresistive resonator and at least one first phase changing device, said piezoresistive resonator having a resonance frequency and the piezoresistive resonator having an input of the piezoresistive resonator for driving the piezoresistive resonator and an output of the piezoresistive resonator coupled back to the input via the first phase changing device. The conditions that have to be met at resonance frequency of the oscillator circuit comprising the piezoresistive resonator in order to get a self-sustaining oscillation are, the loop gain G of the oscillator circuit that means the ratio between output voltage and input voltage has to be bigger than unity and the phase shift Arg(G) across the loop is zero. Piezoresistive resonators as described in WO 2004/053431 are characterized by means of the conversion of an electrostatic input in a mechanical deformation of a resonating structure. The deformation of the resonating structure of the piezoresistive resonator causes a deformation in the crystal lattice of the piezoresistive resonating structure. This deformation further causes a change in the band structure of the piezoresistive resonating structure, leading to a change in the resistivity of the piezoresistive material building the piezoresistive resonating structure. This change of resistivity can be an increase or a decrease according to the type of dopant (n-type or p-type) of the piezoresistive material and can be electrically sensed by means of the variations of a DC current through the piezoresistive structure (piezoresistive output). The advantage of piezoresistive resonators is that no amplification by means of additional active devices as transistors is needed to fulfill the loop gain condition since the piezoresistive resonator can provide an amplification of the input voltage. A drawback is that the piezoresistive readout leads to a $\pi/2$ phase shift between input voltage and output voltage preventing a direct feedback of the resonator output to its input. The combination of a piezoresistive resonator with at least one phase changing device enables compact oscillators by at least partly compensating the phase shift provided by the piezoresistive resonator. The oscillation is self-sustaining as long as the loop gain condition is fulfilled at the frequency where the phase shift around the loop is zero. In addition the phase changing device can be used to transform the impedance of the piezoresistive resonator optimizing the loop gain of the oscillator circuit. Phase changing devices can be e.g. passive devices or a combination of passive devices comprising capacitors, coils, resistors, transformers (a combination of two coils electrically coupled with each other). Using passive devices the impedance of the piezoresistive resonator can be transformed to higher impedances increasing the voltage. At higher impedance, the power V*I stays the same, but the ratio V/I is larger. The voltage gain and consequently the loop gain of the oscillator circuit is increased. An example of a phase changing device that can be combined with the piezoresistive resonator is e.g. a capacitor. The loop gain of this oscillator circuit can be further improved by means of a resistor. Further examples of phase changing devices are active devices as e.g. a second piezoresistive oscillator.

In a second embodiment of the current invention the piezoresistive resonator is combined with at least two phase changing devices. The combination of e.g. a capacitor and a coil added to the piezoresistive resonator enables the possibility to fully compensate the phase change of $\pi/2$ of a piezoresistive resonator by means of passive devices. The full compensation of the phase change around the oscillator loop enables the use of the micro electro mechanical resonator at its resonance frequency. Further the combination capacitor and coil enables to increase the loop gain by means of transforming the impedance of the micro electro mechanical resonator to higher impedance values. Alternative implementations can comprise a LC ladder network or transformer.

In a further embodiment of the current invention the oscillator circuit comprises a first and a second piezoresistive resonator, each having a resonance frequency, each resonator having an input for driving the resonator, and each resonator having its input coupled to an output of the other of the resonators, to provide feedback according to a resistance of the respective resonator. The second piezoresistive resonator is essentially used as phase changing device. This exploits the phase shift between input and output of each resonator, to enable feedback without the need for another component to provide the phase shift. This means a simpler circuit can be used, which can facilitate greater integration and hence lower costs. By using piezoresistive resonators the need for an external crystal can be avoided, enabling greater integration and lower costs. The outputs of the piezoresistive resonators may be fed directly to the respective inputs without amplification. Further the piezoresistive resonators may be arranged in parallel. In that case, each resonator may have a series coupled resistor or choke, each output being taken from between the respective resonator and its series coupled resistor or choke. Each piezoresistive resonator may comprise an elongate member arranged to oscillate along a longitudinal axis of the member. The piezoresistive resonators may each have electrostatic drive electrodes coupled to their respective inputs to drive the elongate members. According to particular embodiments, the elongate members may have a broader end, broader by a factor of 10 or at least a factor of 10 than a body of the elongate member, for use as an electrostatic drive electrode. The oscillator circuit may be suitable for use with a drive voltage of less than 4 volt. This may enable use with existing low voltage circuitry particularly for battery-powered devices.

In another embodiment of the current invention the oscillator circuit comprises at least one piezoresistive resonator, at least one phase changing device and at least one active device. The active device is an amplifying device e.g. a transistor of either n-type as n-MOS transistors or p-type as p-MOS transistors. The active device increases the loop gain. In addition the $\pi/2$ phase shift of the piezoresistive resonator can at least partly be compensated by means of the combination of phase a changing device as e.g. a capacitors with an active device as e.g. a transistor. Further one or more resistors can be used in order to be more independent from the resistivity of the interconnections between the circuit devices improving the flexibility of the circuit design and optimizing the phase shift and the loop gain. The self-sustaining oscillator circuit comprising only capacitors and transistors and optionally resistors has the advantage that no inductors are needed. The integration of high Q inductors with sufficient inductance on silicon is still a challenge for semiconductor processing and the processing of micro electro mechanical systems.

In a further embodiment of the current invention the oscillator circuit comprises at least one piezoresistive resonator, at least one phase changing device, an n-type amplifying device and a p-type amplifying device. A combination of n-type amplifying devices and a p-type amplifying devices as e.g. n-MOS and p-MOS or alternatively npn and pnp bipolar transistors is used as inverter by connecting the gates of both transistors and one of the terminals of each transistor with each other. In comparison to a single n-MOS or p-MOS transistor where the factor contributing to the loop gain is the transconductance $g_{mt}$ of the single transistor the contribution of the combination of n-MOS and p-MOS transistors to the loop gain is the sum $(g_{mt1}+g_{mt2})$, whereby $g_{mt1}$ is the transconductance of the n-MOS transistor and $g_{mt2}$ is the transconductance of the p-MOS transistor. At the same time no extra DC current is drawn. The power dissipation of the oscillator circuit remains the same but the contribution to the loop gain by means of the factor $(g_{mt1}+g_{mt2})$ is essentially doubled.

In another embodiment of the current invention the oscillator circuit comprises n-type and p-type piezoresistive resonators and at least one phase changing device. N-type and p-type piezoresistive resonators are characterized by different piezoresistive Gauge factors K being negative if the piezoresistive resonator is doped n-type and positive if the piezoresistive resonator is doped p-type. The additional piezoresistive resonator (n-type or p-type) can be used to replace a fixed resistor. Are the n-type and p-type piezoresistive resonators switched in series the contribution to the loop gain is given by the sum $(g_{mr01}+g_{mr02})$ of the transconductance $g_{mr01}$ of the n-type and the transconductance $g_{mr02}$ of the p-type piezoresistive resonator instead of $g_{mr0}$ if only one piezoresistive resonator is implemented. The loop gain is essentially doubled, whereby the power dissipation is the same since no extra DC-current is drawn. In addition oscillator circuits with n-type and a p-type piezoresistive resonator can be combined with active devices as transistors. An additional capacitor or capacitors enable further possibilities to optimize the loop gain and fulfilling the phase condition at the same time. The phase shift of the n-type and p-type piezoresistive resonator can be fully compensated enabling the oscillator circuit to work at the resonance frequency of the n-type and p-type piezoresistive resonator. Using more than one active device as a combination of n-type amplifying device and p-type amplifying device as e.g. n-MOS and p-MOS transistors in the oscillator circuit is a further option. The n-MOS and p-MOS transistors are switched in an inverter circuit as described above. The power consumption of the oscillator circuit is reduced whereby the constraints given by the loop gain condition and the phase shift around the loop remain the same in the embodiment where only one active device is implemented in the oscillator circuit.

The piezoresistive resonator or the piezoresistive resonators in the different embodiments can be formed as MEMS structure. The combination of MEMS processing with well-known semiconductor processing enables very compact oscillator circuits. Passive structures as resistors and capacitors, the piezoresistive resonator and active devices as transistors can be processed in one coherent process flow. Size and cost of the oscillator circuit can be reduced. Parasitic effects caused by e.g. interconnections can be essentially eliminated.

It's further an objective of the current invention to provide an integrated oscillator comprising an oscillator circuit according to the different embodiments of the current invention. The integration of the oscillator circuits on one substrate whereby the substrate can be a semiconductor substrate as e.g. a silicon substrate or a GaAs substrate or alternatively a glass or ceramic substrate enables very compact oscillators.

It's further an objective of the current invention to provide a Method for driving a piezoresistive resonator comprising the steps of:
  driving the piezoresistive resonator via an input of the piezoresistive resonator;
  coupling back an output of the piezoresistive resonator to the input of the piezoresistive resonator via at least one phase changing device.

The driving can e.g. be done by means of a battery powered drive circuit.

Additional features will be described below which can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

The present invention will now be explained in greater detail with reference to the figures, in which the same reference signs indicate similar parts, and in which:

FIG. 8b shows an alternative representation of the circuit diagram shown in FIG. 8a.

FIG. 11b shows an alternative representation of the circuit diagram shown in FIG. 11a.

Figure 1:
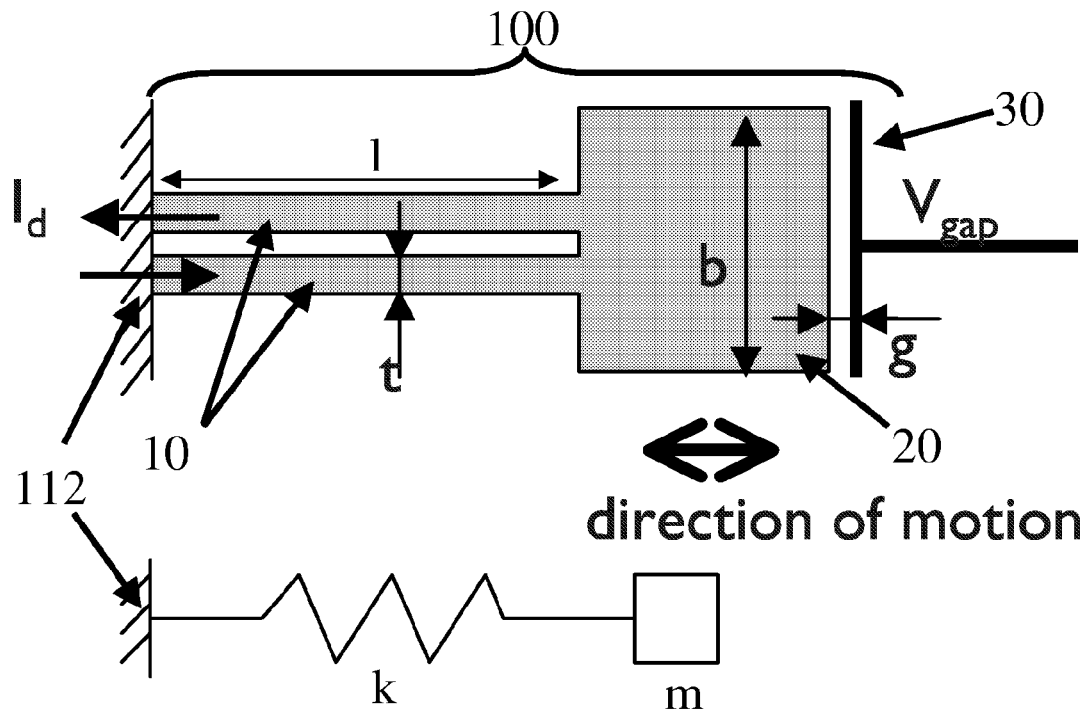
FIG. 1 shows a principal sketch of a top view of a piezoresistive resonator.

The upper part of FIG. 1 shows a plan view of piezoresistive resonator layout as is described in WO2004/053431. The piezoresistive resonator 100 comprises piezoresistive conductor lines 10 of a width t and a length 1 attached to the anchor 112 at the one side and to the resonator electrode 20 of essentially square shape with a width b on the other side. The height of the resonator electrode 20 is given by h (not shown). The resonator electrode 20 faces an actuation electrode 30 forming a plate capacitor with a gap g between the resonator electrode 20 and the actuation electrode 30. Applying a voltage between the resonator electrode 20 and the actuation electrode 30 causes a deformation of the piezoresistive conductor lines 10 changing the electrical resistance of the piezoresistive conductor lines 10 by means of the piezoresistive effect. The variation of the electrical resistance is sensed with a current $I_d$ passing the piezoresistive conductor lines 10 and the resonator electrode 20.

The behavior of the piezoresistive resonator 100 can be modeled as a spring-mass system as indicated in the lower part of FIG. 1 characterized by a spring constant k essentially determined by the piezoresistive conductor lines 10 (material and geometric dimensions) and the mass m essentially determined by the resonator electrode 20 (material and geometric dimensions). The spring constant k and the mass determine the resonance frequency of the piezoresistive resonator.

Figure 2:
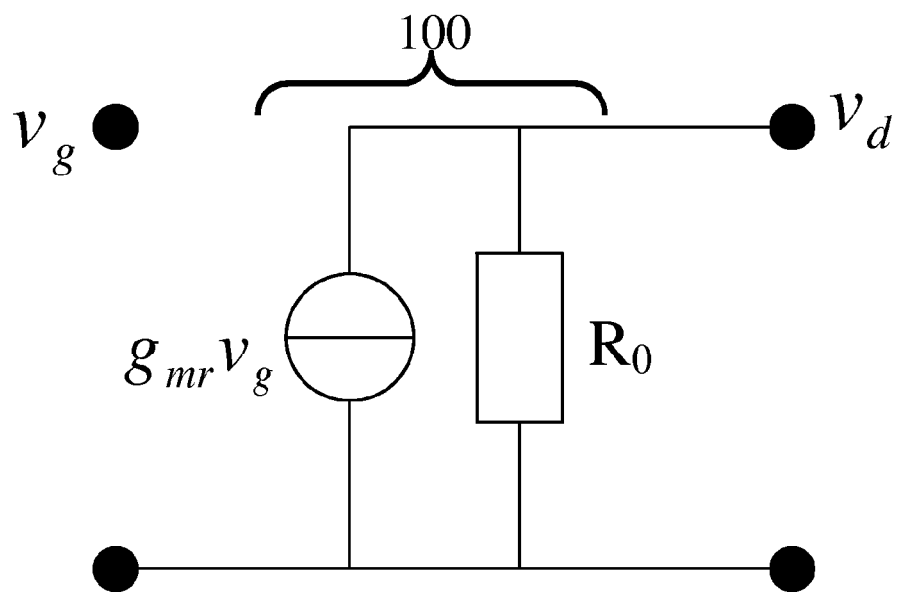
FIG. 2 shows the equivalent small-signal circuit of a piezoresistive resonator without biasing lines.

The small-signal equivalent circuit of the piezoresistive resonator 100 at resonance is depicted in FIG. 2 and is described in patent application WO2004/053431. The resistance $R_0=1/g_d$ is the nominal resistance of the resonator and the transconductance $g_{mr}$ describes the resonating behavior and is given by (1), $$g_{mr} = g_{mr0} \frac{1}{\left(1 - \frac{\omega^2}{\omega_0^2} + j\frac{\omega}{\omega_0 Q}\right)} \quad (1)$$

$$g_{mr0} = -I_d V_{gap} \frac{\varepsilon_0}{2} \frac{K}{E} \frac{b}{tg^2}$$

with Q the quality factor, $\omega_0$ the resonance frequency, $I_d$ the DC current through the piezoresistive resonator, $V_{gap}$ the DC voltage across the gap, g the gap width, K/E the ratio of the piezoresistive gauge factor and Young's modulus, and b/t the ratio of the width t of the piezoresistive conductor lines 10 and the width b of the resonator electrode 20 as depicted in FIG. 1. The phase change between input voltage and output voltage caused by the piezoresistive resonator is π/2 preventing a self-sustaining oscillation, whereby the loop gain condition is given by (2), $$Qg_{mr0}R_0 > 1 \quad (2)$$

and can be fulfilled by adapting the geometric dimensions b and t and the ratio of the piezoresistive gauge factor and Young's modulus.

Figure 3A:
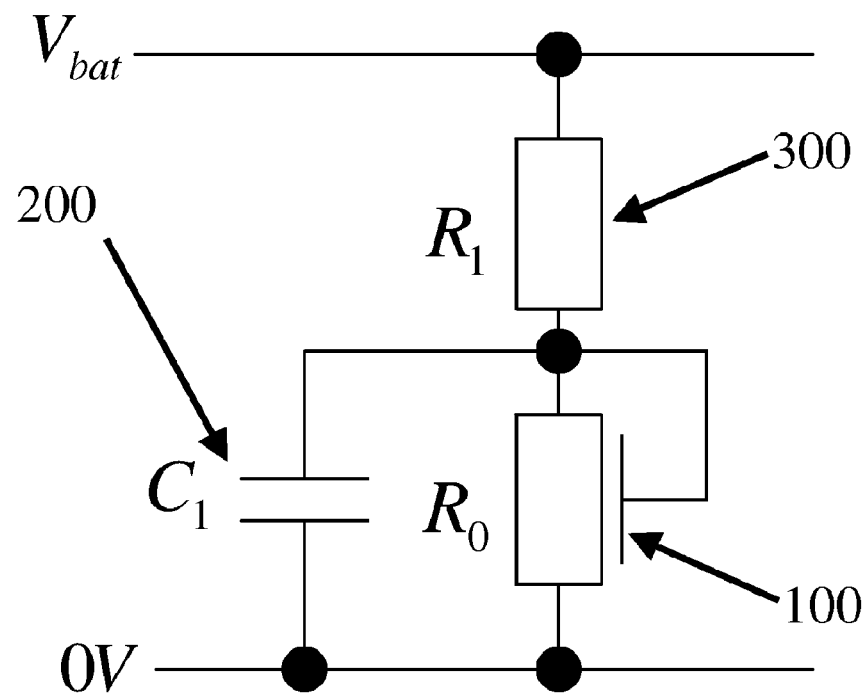
FIG. 3a shows a circuit diagram of a first embodiment according to the current invention with a piezoresistive resonator, a capacitor and a resistor.
Figure 3B:
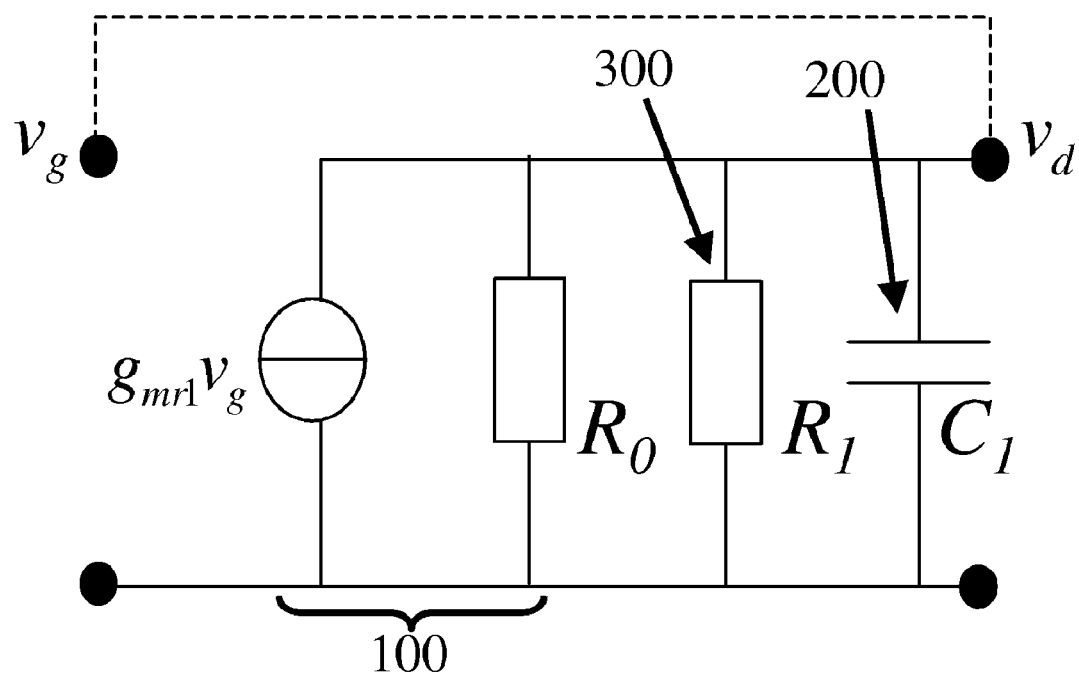
FIG. 3b shows the equivalent small-signal circuit of the circuit diagram depicted in FIG. 3a without biasing lines.

FIG. 3a shows a first embodiment of the current invention and FIG. 3b the small signal circuit of the first embodiment at resonance frequency with the input voltage $v_g$ and the output voltage $v_d$. In FIG. 3a the output of the piezoresistive resonator 100 is fed back to the input of the piezoresistive resonator 100 and a capacitor 200 parrallel to the piezoresistive resonator 100 transforms the impedance of the piezoresistive resonator 100 and provides a phase shift in order to get a self-sustaining oscillator. A resistor 300 is used to bias the piezoresistive resonator 100. The resistor 300 can be used to further optimize the oscillator circuit but is not essential for the function of the oscillator since it can be replaced e.g. by a current source. The oscillator circuit is driven by a voltage source with a voltage $V_{bat}$. Due to the resistance of the interconnections between the different circuit devices in a real circuit and the limitations with respect to the capacity that can be provided by means of the capacitor 200 especially in a fully integrated circuit, no full compensation of the π/2 phase shift caused by the piezoresistive resonator 100 can be provided. In addition the loop gain condition G>1 has to be fulfilled in order to get a self-sustaining oscillator but the loop gain G is influenced by means of the impedance transformation of the capacitor 200 and the resistor 300. From this observation it is concluded that there exists an optimum reactance where both the phase shift and loop gain G are optimal. Taking the small signal equivalent circuit as shown in FIG. 3b the phase condition translates into (3), $$\omega^2 = \omega_0^2 + \frac{\omega_0}{QR_{tot}C_1} \quad (3)$$

with $$R_{tot} = \frac{R_0 R_1}{R_0 + R_1},$$

and quality factor Q. For large Q, the gain condition is now given by (4), $$Q g_{mr0} R_{tot} \left[ \frac{1}{\omega_0 C R_{tot}} + \omega_0 C R_{tot} \right]^{-1} > 1 \quad (4)$$

From equation (4) can be concluded that the maximum oscillator gain is obtained when condition in (5) is met, $$\omega_0 C R_{tot} = 1 \quad (5)$$

than the RC network introduces a phase shift of 45°. Combining (5) with (3) results in (6), $$\omega^2 = \omega_0^2 \left( 1 + \frac{1}{Q} \right) \quad (6)$$

Since Q is large the resonance frequency only slightly differs from the resonance frequency of piezoresistive resonator 100. The optimized loop gain according to (5) enables a self sustaining oscillator circuit as long as (7)

$$\frac{1}{2} Q g_{mr0} R_{tot} > 1 \quad (7)$$

is fulfilled, whereby $R_{tot}$ is maximum if $R_0 = R_1$.

Figure 4A:
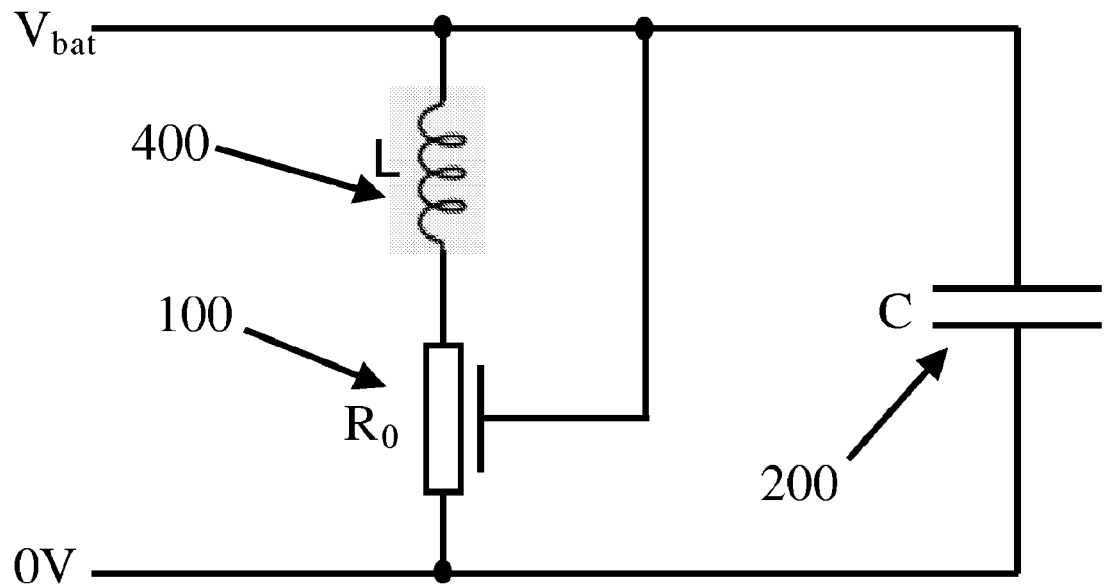
FIG. 4a shows a circuit diagram of a second embodiment according to the current invention with a piezoresistive resonator, a capacitor and a coil.
Figure 4B:
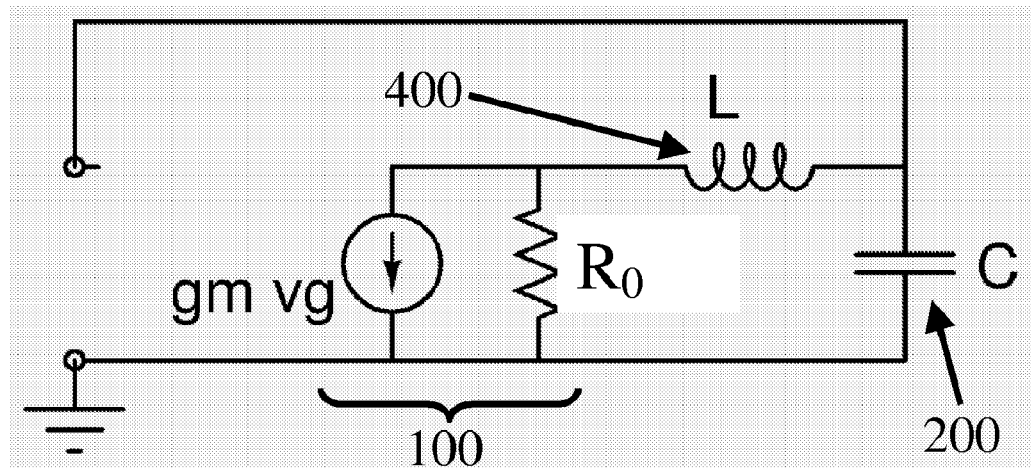
FIG. 4b shows the equivalent small-signal circuit of the circuit diagram depicted in FIG. 4a without biasing lines.

FIG. 4a shows a second embodiment of the current invention and FIG. 4b the small signal circuit of the second embodiment at resonance frequency. In FIG. 4a a coil 400 is in series with the piezoresistive resonator 100. This series configuration of coil 400 and piezoresistive resonator 100 is switched parallel to a capacitor 200. The output signal of the piezoresistive resonator 100 is fed back to the input of the piezoresistive resonator after the coil 400. For the small signal circuit as shown in FIG. 5b, it can be shown that the phase condition for a piezoresistive resonator is satisfied if (8) is fulfilled, $$Q(\omega^2 - \omega_0^2) = \frac{R_0 C \omega^2 \omega_0}{CL\omega^2 - 1} \quad (8)$$

The substitution of this condition in the gain condition results in (9), $$\frac{CL\omega^2 - 1}{R_0 C \omega} = \frac{\omega \omega_0}{Q(\omega^2 - \omega_0^2)} = 1 \quad (9)$$

If $\Delta\omega = \omega - \omega_0$, the maximum gain occurs if $\Delta\omega = \omega_0/2Q$. From the phase condition we find that for the piezoresistive oscillator (10) is valid, $$LC = \frac{1 + R_0 C \omega_0}{\omega_0^2} \approx \frac{1}{\omega_0^2} \quad (10)$$

The equality on the right side is only valid if the impedance of the capacitor is much larger than that of the output resistor. The maximum loop gain obtained is (1), $$G = \left| \frac{v_d}{v_g} \right| = \frac{g_{mr0} Q}{2 C \omega_0} \quad (11)$$

Equation 11 shows that by introducing the LC circuit, the loop gain can be increased by a factor of $1/(2R_0 C \omega_0)$ in comparison to equation 2 describing the gain condition if no LC circuit is present. In addition the phase shift of the piezoresistive resonator 100 is compensated. By using a smaller value of the capacitance C a larger gain can be achieved. As an example, if $R_0$ is 1 kΩ, C=100 fF and $\omega_0$=10 MHz, results in an increase in voltage gain by a factor of around 80. Alternatively the ratio b/t can be reduced as can be seen from equation (1). A further advantage of the circuit as depicted in FIG. 4a is that the circuit works as a low pass filter reducing unwanted higher harmonics.

Figure 5:
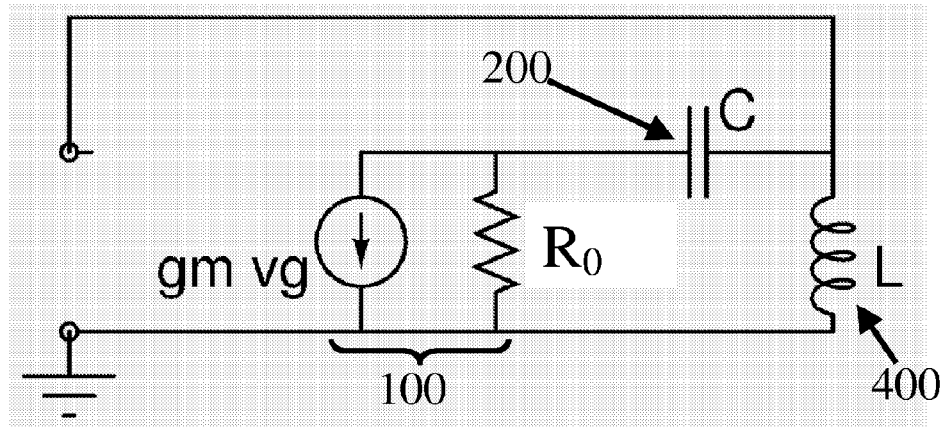
FIG. 5 shows an equivalent small-signal circuit of a third embodiment according to the current invention with a piezoresistive resonator, a capacitor and a coil.

FIG. 5 shows an equivalent small-signal circuit at resonance frequency of a third embodiment according to the current invention with a piezoresistive resonator 100, a capacitor and a coil. In comparison to the second embodiment the position of the capacitor 200 and the coil 400 are exchanged. This exchange affects only the phase slightly, most of the conclusions in connection with FIGS. 4a and 4b are also valid for this circuit. The main difference is that in this implementation the LC combination will act as a high-pass filter, it will therefore not block unwanted oscillation at higher frequencies, but will block them at lower frequencies.

Figure 6:
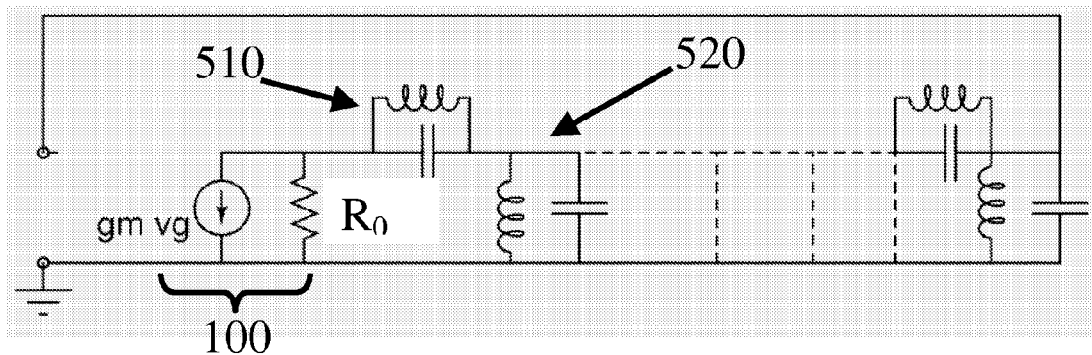
FIG. 6 shows an equivalent small-signal circuit of a fourth embodiment according to the current invention with a piezoresistive esonator, and a ladder network of capacitors and coils.

FIG. 6 shows an equivalent small-signal circuit of a fourth embodiment according to the current invention with a piezoresistive resonator, and a ladder network of capacitors and coils. The ladder network shown in FIG. 6 comprises LC parallel circuits 510 switched in series and LC parallel circuits 520 connected to ground. This embodiment has essentially the same advantages as the embodiment shown in FIGS. 4a and 4b. By proper choice of the capacitor and inductor values it achieves a similar impedance transformation to higher impedances. However it can have additional advantages of providing a filter function, which suppresses oscillation at unwanted frequencies. Another advantage is that the values of the inductors and capacitors needed for the impedance transformation are less critical (smaller inductors and larger capacitances can be tolerated).

Figure 7:
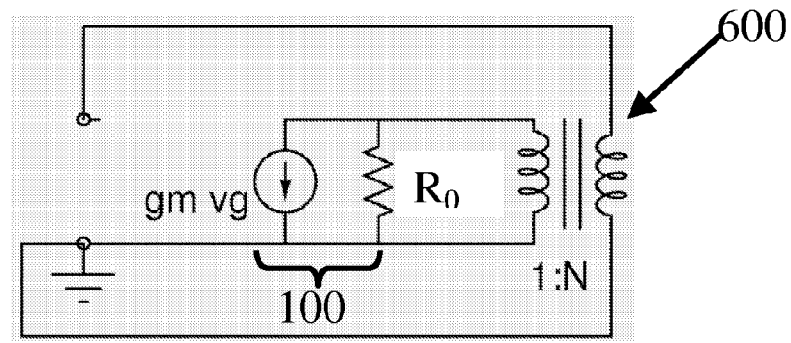
FIG. 7 shows an equivalent small-signal circuit of a fifth embodiment according to the current invention with a piezoresistive resonator and a coil transformer.

FIG. 7 shows an equivalent small-signal circuit of a fifth embodiment according to the current invention with a piezoresistive resonator and a transformer. In this embodiment the impedance transformation is achieved using a step up transformer (e.g. air core or ferrite core). If the input impedance of the piezoresistive resonator 100 is very high, the performance will improve for larger step up ratio N. An additional phase shifter can be added to the loop to satisfy the phase condition.

Figure 8A:
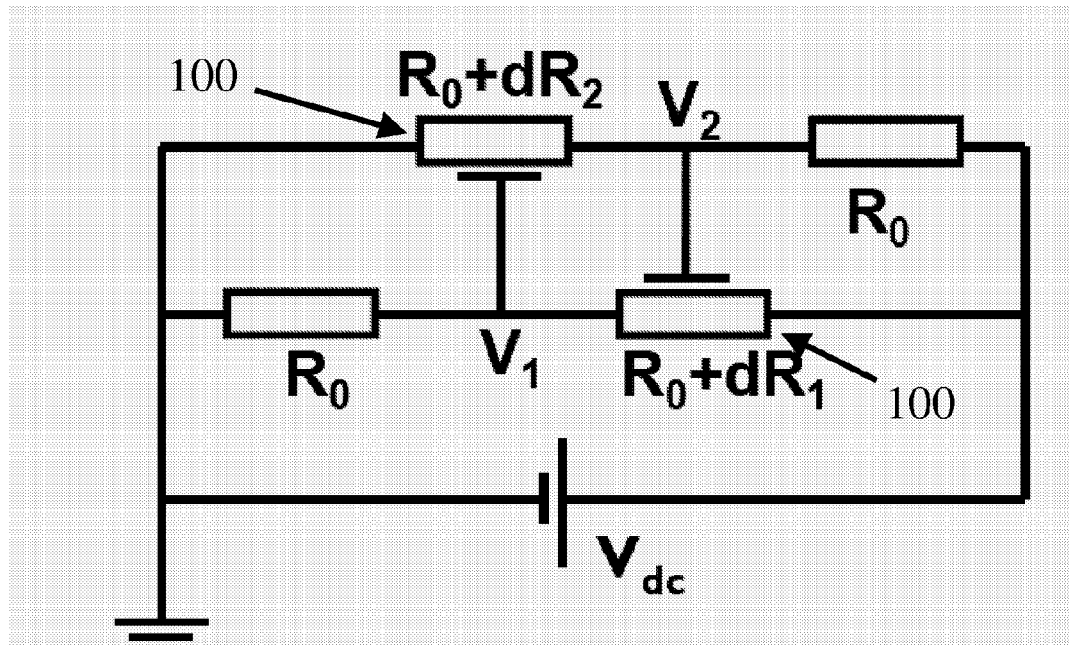
FIG. 8a shows a circuit diagram of a sixth embodiment according to the current invention with two piezoresistive resonators and two resistors.

FIG. 8a shows an oscillator circuit layout in accordance with an embodiment of the present invention in which two piezoresistive resonators are used to compensate for the π/2 phase shift of a single resonator. The oscillator circuit consists of 2 parallel branches. Each branch consists of a resonating resistor 100, labeled as $R_0+dR_1$, and $R_0+dR_2$, which form piezoresistive resonators as is described in WO2004/053431, for example, and a fixed resistor connected in series. When piezoresistive resonators 100 are vibrating at a frequency $\omega$, than their resistance is given by, $R_{1,2}=R_0(1+\alpha \sin \omega t)$ with $$\alpha = \frac{dR_{max}}{R_0}$$

The voltages $V_{1,2}$ are than given by (12), $$V_1 = V_{dc}\frac{1}{2+\alpha\sin\omega t} \approx \frac{V_{dc}}{2}\left(1 - \frac{\alpha}{2}\sin\omega t\right); \quad (12)$$
$$V_2 = V_{dc}\frac{1+\alpha\sin\omega t}{2+\alpha\sin\omega t} \approx \frac{V_{dc}}{2}\left(1 + \frac{\alpha}{2}\sin\omega t\right)$$

when the fixed resistor has a value equal to $R_0$.

$V_1$ is now fed back to the piezoresistive resonator in branch 2, which leads to a phase shift of $\Phi_1=-\pi/2$ in $dR_2$ at resonance $\omega_0$. The phase difference, $\Phi_2$ between $dR_2$ and $V_2$ is zero according to equation (12). When $V_2$ is fed back to the piezo-resistive resonator in branch 1, then the phase in $dR_1$ is again shifted $\Phi_3=-\pi/2$ with respect to $V_2$. Between $dR_1$ and V1 a phase shift, $\Phi_4=\pi$ is encountered according to equation (12). The total phase shift around the loop is $\Phi_{tot}=\Phi_1+\Phi_2+\Phi_3+\Phi_4=0$, which will result in sustained oscillation when the loop gain, $$G(\omega_0) = \frac{V_1}{V_2} = 1.$$

Figure 8B:
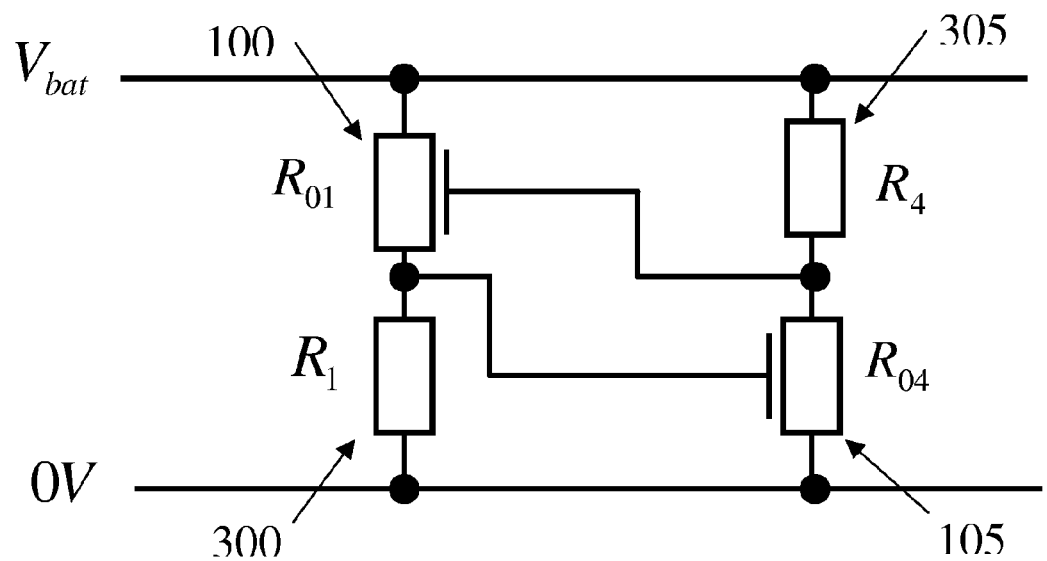
Figure 8C:
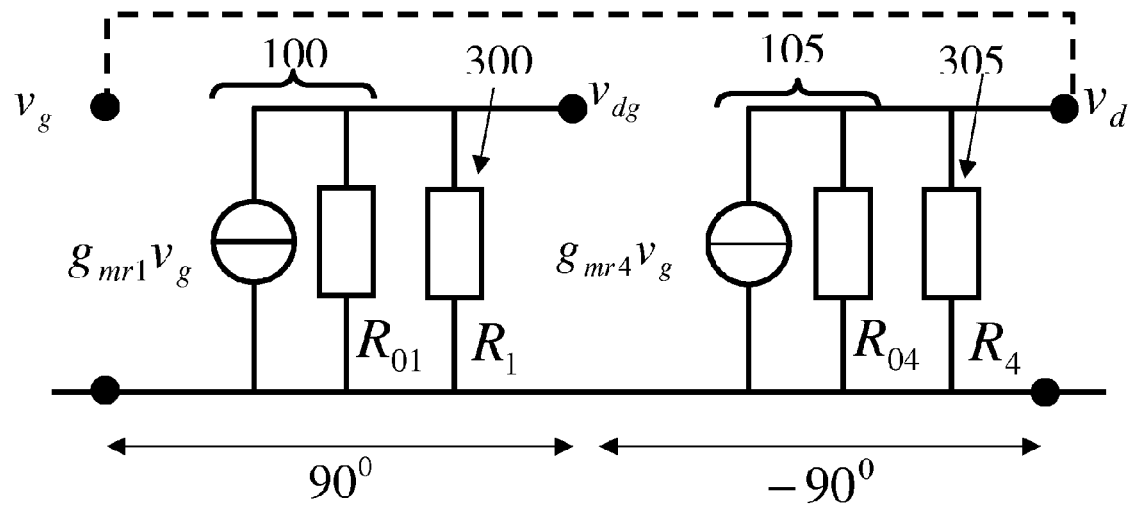
FIG. 8c shows the equivalent small-signal circuit of the circuit diagram depicted in FIG. 8b without biasing lines.
Figure 9:
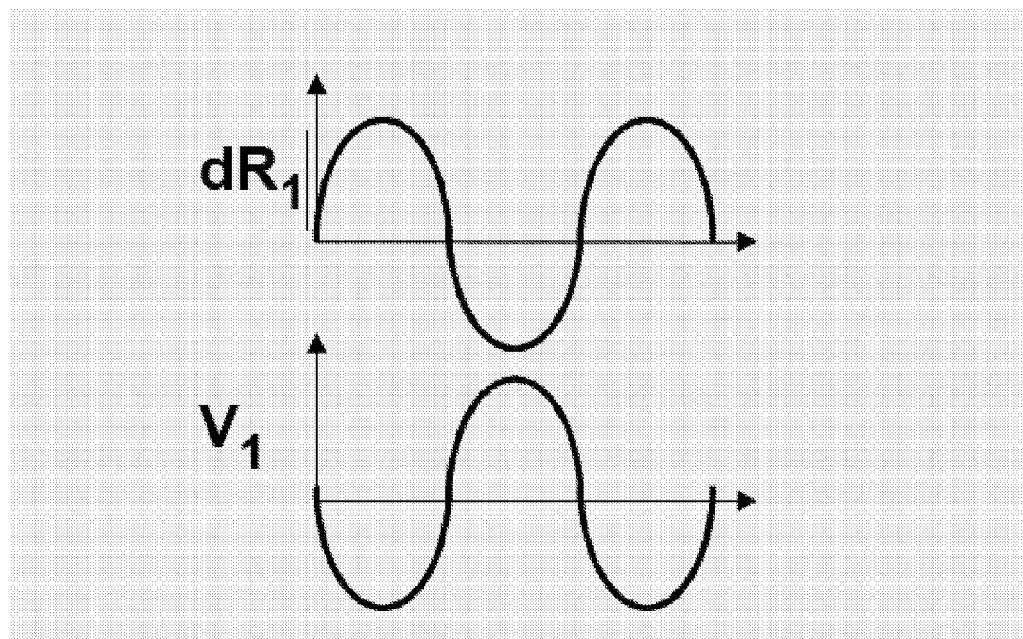
FIGS. 9 and 10 show variation of dR and V at resonance as a function of time

FIG. 8*b*. shows a further sketch of the embodiment depicted in FIG. 8*a* and in FIG. 8*c* the corresponding small-signal is shown. In comparison to FIG. 8*a* the piezoresistive resonator 100, 105 can be different and the resistors 300, 305 can be different. The resistor 300 is in series with piezoresistive resonator 100 and resistor 305 is in series with piezoresistive resonator 105. The working principal as discussed in combination with FIG. 8*a* is the same. The loop gain condition is given by (13), $$G = Q_1 g_{mr0,1}\frac{R_1 R_{01}}{R_1 + R_{01}} Q_4 g_{mr0,4}\frac{R_4 R_{04}}{R_4 + R_{04}} > 1 \quad (13)$$

The oscillator circuit as described in FIG. 8*a*, FIG. 8*b* and FIG. 8*c* can be further improved by replacing the fixed resistors with choke coils CH1, CH2, as is shown in FIG. 11. In this case, less power is consumed since no dissipation occurs in the coils. In this case $V_1$ and $V_2$ are given by (14), $$V_1=-V_{dc}\alpha \sin \omega t; V_2=V_{dc}(1+\alpha \sin \omega t) \quad (14)$$

The loop gain at resonance for the circuit shown in FIG. 11 is determined by the relative change in resistance $$\frac{dR}{R_{1,2}} = \alpha$$

sin $\omega t$ as a result of a voltage $V_{2,1}$. The voltage $V_{2,1}$ generates an electrostatic $F_{el}$ on the resonator of magnitude given by equation (15), $$F_{el} = V_{1,2} V_{dc} \frac{\varepsilon_0 bh}{2g^2}, \quad (15)$$

in which b is the electrode width, h the electrode height, and g the gap between the electrode and the resonator, as is depicted in FIG. 1. This figure shows that the device has an elongate oscillating member with a body formed of two beams of width t, with a broader part at one end having much greater width b. The broader end is shown as a square, but other shapes are possible, for use as the electrostatic drive electrode. The force $F_{el}$ generates a strain $\epsilon$ in the resonator beam of magnitude given by equation (16), $$\varepsilon = \frac{F_{el}}{2E \cdot t \cdot h} \quad (16)$$

Combining equation (15) and (16) yields (17), $$\varepsilon = \frac{\varepsilon_0}{4E}\frac{b}{tg^2}V_{dc}V_{1,2} \quad (17)$$

At resonance $\epsilon$ is amplified by the quality factor, Q. The relative change in resistance is proportional with the strain and is given by (18), $$\frac{dR}{R} = K\varepsilon \quad (18)$$

in which K is the piezo resistive gauge factor. Combining equations (14), (17), and (18) gives (19) and (20), $$\frac{V_{2,1}}{V_{dc}} = K\frac{\varepsilon_0}{4E}\frac{b}{tg^2}QV_{dc}V_{1,2} \quad (19)$$

$$G = \left|\frac{V_{2,1}}{V_{1,2}}\right| = V_{dc}^2 \frac{\varepsilon_0 K}{4E}\frac{b}{tg^2}Q \quad (20)$$

Oscillation will sustain when G>1, therefore if (21) is fulfilled, $$\frac{b}{t}\left(\frac{V_{dc}}{g}\right)^2 > \frac{4E}{\varepsilon_0 KQ} \quad (21)$$

For a Si resonator processed in n-type 1 $\Omega$.cm silicon, which is oriented parallel to the (100) axis E=130 GPa and K=-151. Assuming Q=$10^5$ [see Mattila et. al., Sensors and Actuators A, 3204 (2002) 1-6] then the right side of (21) results in (22), $$\left|\frac{4E}{\varepsilon_0 KQ}\right| = 3.8 \times 10^{15} V^2 m^{-2} \quad (22)$$

Assuming g=0.2 $\mu$m and $V_{dc}$=3.6V (=battery voltage) then (23) has to be fulfilled, $$\frac{b}{t} > 12 \quad (23)$$

which is within range of manufacturing capabilities. Therefore, sustained oscillation can be achieved at battery voltage.

Figure 11A:
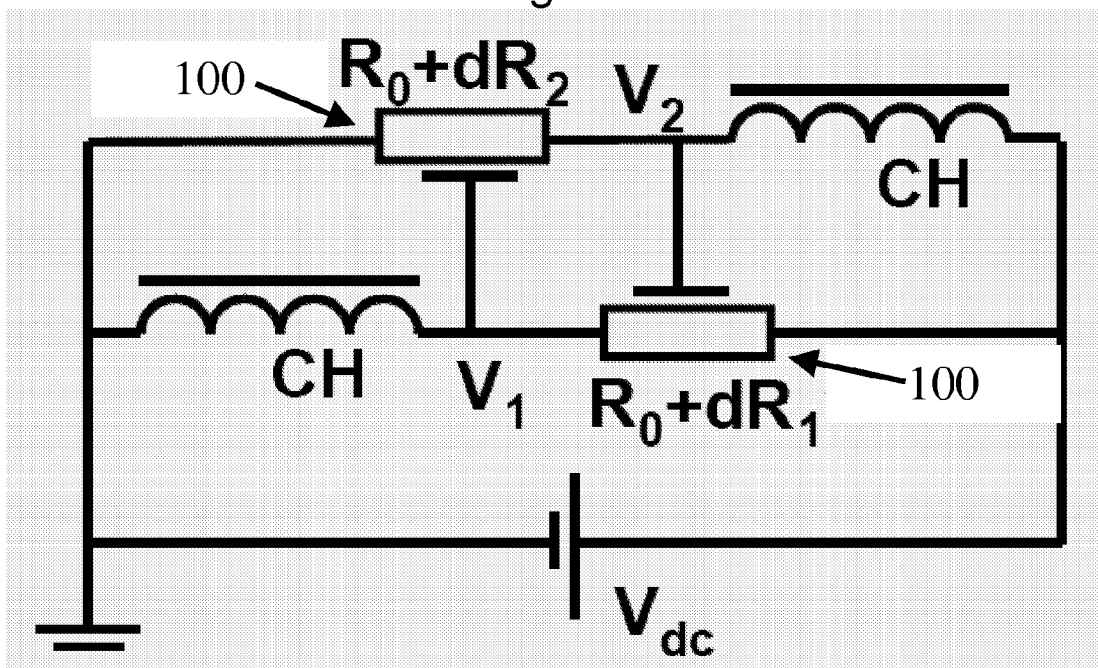
FIG. 11a shows a piezoresistive oscillator circuit with choke coils.
Figure 11B:
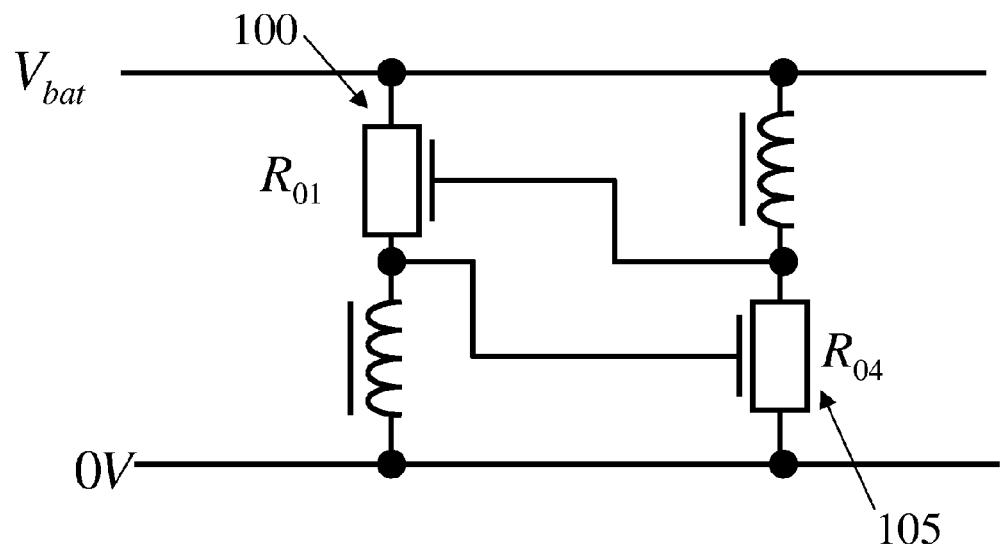
Figure 11C:
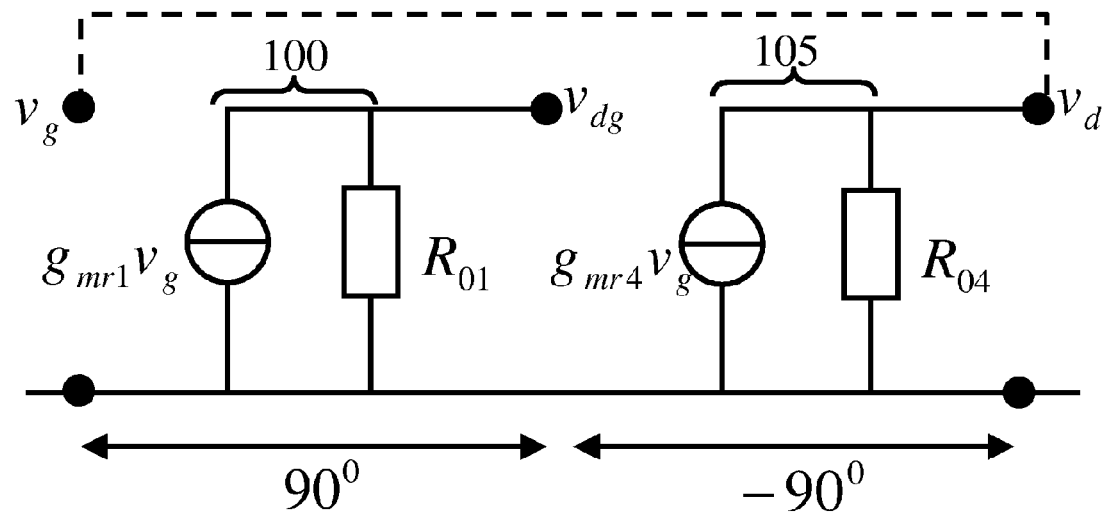
FIG. 11c shows the equivalent small-signal circuit of the circuit diagram depicted in FIG. 11b without biasing lines.

FIG. 11b. shows a further sketch of the embodiment depicted in FIG. 11a and in FIG. 11c the corresponding small-signal is shown. In comparison to FIG. 11a the piezoresistive resonator 100, 105 can be different. An alternative representation of the loop gain condition shown in equation (20) is given by (24), $$G = Q_1 g_{mr0,1} R_{01} Q_4 g_{mr0,4} R_{04} > 1 \quad (24)$$

As shown in the lower part of FIG. 1, the resonance frequency of the piezoresistive resonator 100 can be approximated by modeling its geometry as a mass spring system in which the spring constant k, proof mass m, and resonance frequency $\omega_0$ are given by (25), $$k = \frac{2th}{l} E \quad (25)$$
$$m = b^2 h \rho$$
$$\omega_0 = \sqrt{\frac{k}{m}} = \frac{1}{b}\sqrt{\frac{2t}{l}\frac{E}{\rho}}$$

When the resonator is scaled in x, y, and z direction with a factor $\gamma$ it can be seen from equation (25) that the resonance frequency $\omega_0$ scales with $\gamma^{-1}$. From equation (21) it can be seen that the oscillation condition does not depend on the scaling factor $\gamma$. Therefore it is concluded that sustained oscillation is independent of resonator size, which allows for small scale implementation resulting in a high oscillation frequency. This conclusion does not hold for a capacitive MEMS oscillator. For a capacitive resonator its impedance increases when its size decreases. In this case, more amplifier gain is needed in order to sustain the oscillation when going to higher oscillating frequencies.

The oscillator noise floor is determined by the Johnson-Nyquist noise generated in the resistor and is given by, $V_{noise}^2 = 4k_B T R_0 \cdot \Delta f$. The average voltage swing $V_{1,2}$ is given by, $\overline{V_{1,2}^2} = V_{dc}^2 \alpha_{max}^2 / 2$. The time average power consumption of the oscillator is given by, $$\overline{P} = 2\frac{V_{dc}^2}{R_0}.$$

This results in a noise floor given by (26), $$\left(\frac{\overline{V_{noise}}}{\overline{V_{1,2}}}\right)^2 = \frac{16 k_B T \Delta f}{\overline{P} \alpha^2} \quad (26)$$

Assuming T=300K, P=1 mW, and $\alpha_{max} > 0.1$ results in a phase noise floor (=half total noise floor) of <−145 dBc/Hz, which rivals the noise floor performance of a quartz oscillator. From equation (26) it can be seen that the noise floor does not depend on resonator dimensions. This means the noise floor does not change when scaling the piezoresistive resonator. This property allows for high frequency operation without degrading the phase noise floor or without added power consumption.

Figure 12A:
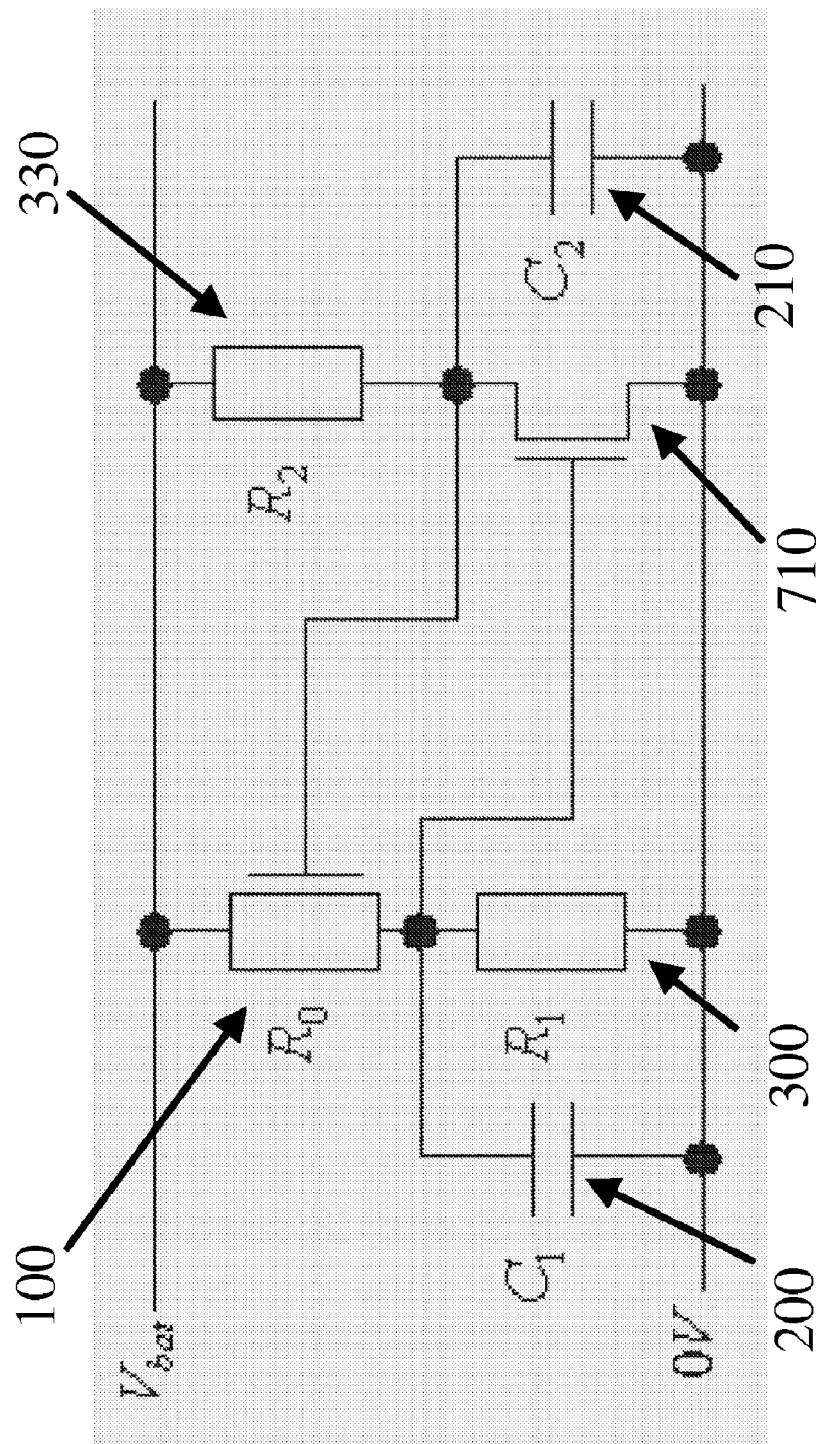
FIG. 12a shows a circuit diagram of a seventh embodiment according to the current invention with a piezoresistive resonator, a transistor, capacitors and resistors.
Figure 12B:
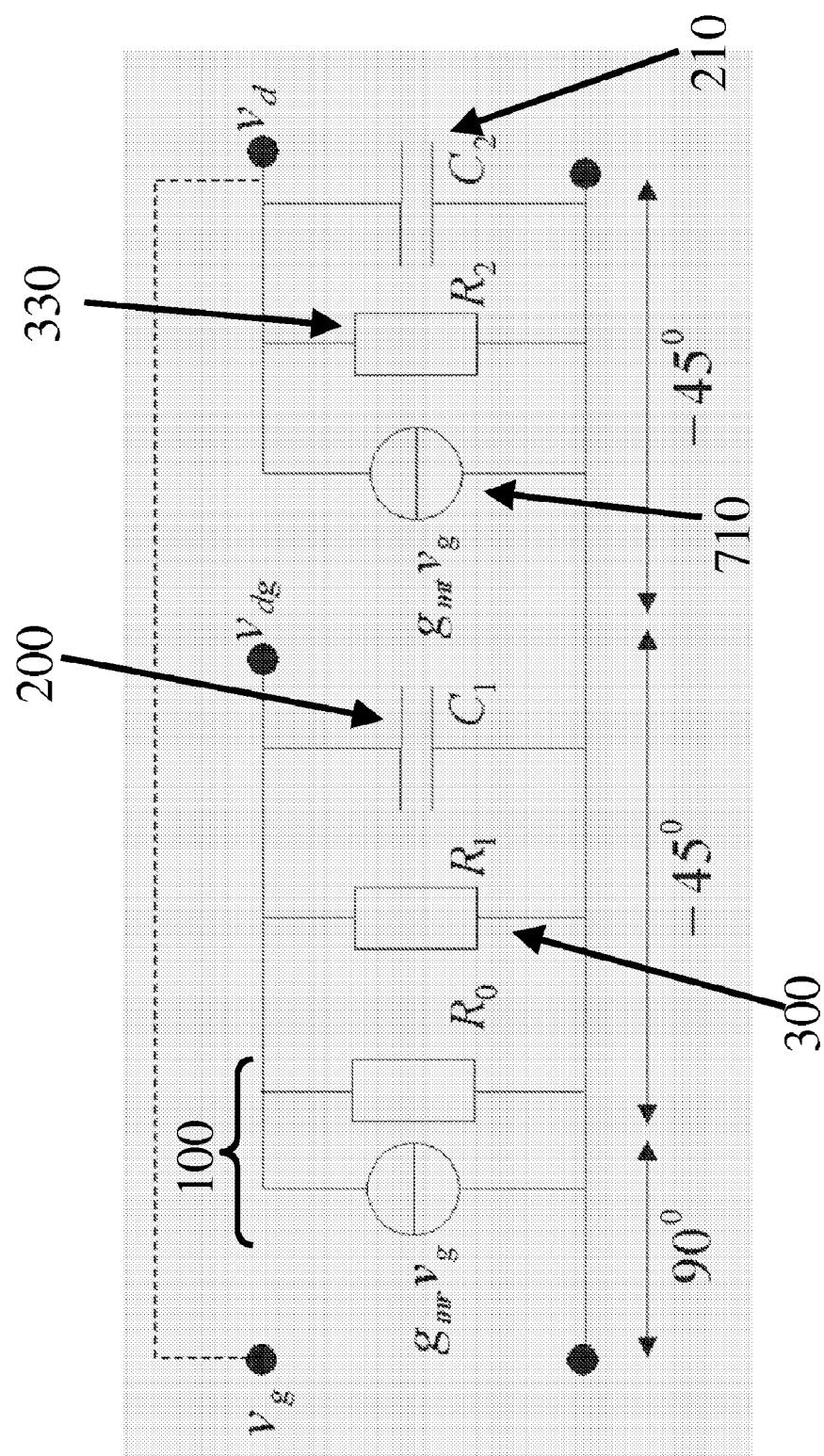
FIG. 12b shows the equivalent small-signal circuit of the circuit diagram depicted in FIG. 12a without biasing lines.

FIG. 12a shows a seventh embodiment of the current invention and FIG. 12b the small signal circuit of the seventh embodiment at resonance frequency with the input voltage $v_g$ and the output voltage $v_d$. The circuit diagram depicted in FIG. 12a shows a piezoresistive resonator 100, which is biased by a resistor 300. The output of the piezoresistive resonator 100 is fed to the gate of a transistor 710, which is biased with a resistor 330. The output at the transistor 710 drain is fed back to the input of the piezoresistive resonator 100. A capacitor 200 is switched in parallel to the resistor 300. A capacitor 210 is switched parallel to the transistor 710. The $\pi/2$ phase shift introduced by the piezoresistive resonator is compensated by the parallel RC circuit comprising the resistor 300 and the capacitor 200 connected to the piezoresistive resonator 100 together with the parallel RC circuit comprising the resistor 330 and the capacitor 210 connected to the drain of the transistor 710. From the small signal circuit at resonance frequency depicted in FIG. 12b it can be derived that the loop gain is given by (27), $$G(\omega) = g_{mt} g_{mr0} \frac{1}{\left(1 - \frac{\omega^2}{\omega_0^2} + j\frac{\omega}{\omega_0 Q}\right)} \frac{R_{tot}}{(1 + j\omega C_1 R_{tot})} \frac{R_2}{(1 + j\omega C_2 R_2)} \quad (27)$$

whereby $g_{mt}$ is the transconductance of the transistor 710 and $R_{tot}$ is given by (28), $$R_{tot} = \frac{R_0 R_1}{R_0 + R_1} \quad (28)$$

This can be rewritten as (29), $$G(\omega) = g_{mt} g_{mr0} R_{tot} R_2 \frac{1}{\left(1 - \frac{\omega^2}{\omega_0^2} + j\frac{\omega}{\omega_0 Q}\right)\left(1 - \frac{\omega^2}{\omega_1^2} + j\frac{\omega}{\omega_1 Q_1}\right)} \quad (29)$$

with (30), $$\omega_1 = \frac{1}{\sqrt{C_1 R_{tot} C_2 R_2}} \quad (30)$$
$$Q_1 = \frac{\sqrt{C_1 R_{tot} C_2 R_2}}{C_1 R_{tot} + C_2 R_2} = \left(\sqrt{\frac{C_1 R_{tot}}{C_2 R_2}} + \sqrt{\frac{C_2 R_2}{C_1 R_{tot}}}\right)^{-1}$$

When $\omega_1 = \omega_0$ than (29) reduces to (31), $$G(\omega_0) = g_{mt} g_{mr0} R_{tot} R_2 Q Q_1 \quad (31)$$

From (31) it can be seen that the open loop gain is always real when $\omega_1 = \omega_0$ and hence the phase condition is always met. Furthermore, from (30) can be seen that $Q_1$ has a maximum when $C_1 R_{tot} = C_2 R_2$ and equals ½ resulting in (32), $$G(\omega_0) = g_{mt} g_{mr0} R_{tot} R_2 \frac{Q}{2} > 1 \quad (32)$$

Combining (32) with (28) and (1) and setting $I_d = V_{bat}/(R_0 + R_1)$ the gain condition reduces to (33), $$g_{mt} R_2 V_{bat} V_{gap} \frac{2\varepsilon_0}{\pi^2} \frac{K}{E} \frac{b}{tg^2} \frac{R_0 R_1}{(R_0+R_1)^2} Q > 1 \qquad (33)$$

The loop gain is maximum when $R_0 = R_1$ resulting in (34), $$g_{mt} R_2 \frac{3}{4} V_{bat}^2 \frac{\varepsilon_0}{2\pi^2} \frac{K}{E} \frac{b}{tg^2} Q > 1 \qquad (34)$$

The expression in (34) has to be fulfilled in order to start a self-sustaining oscillation.

Taking $g_{mt} = 1$ mS ($10^{-3} \Omega^{-1}$) a generic value of the transconductance of the transistor 710 and $R_2 = 20$ kΩ causing acceptable losses as discussed below, the loop gain is increased by a factor 20. At the same time the phase condition is fully met. Further taking the condition $C_1 R_{tot} = C_2 R_2$ and the upper part of (30) results in (36), $$\omega_1 = \frac{1}{C_1 R_{tot}} \qquad (36)$$

with $\omega_1 = \omega_0$ as described above and $\omega_0 = 10$ MHz this results in a capacitance of 5 pF for capacitor $C_2$ (capacitor 210) and 10 pF for capacitor $C_1$ (capacitor 200) if $R_0 = R_1 = R_2$. Consequently the capacitors (200, 210) as well as the resistors (300, 330), the piezoresistive resonator 100 and the transistor 710 can easily be integrated on one silicon substrate.

Figure 13A:
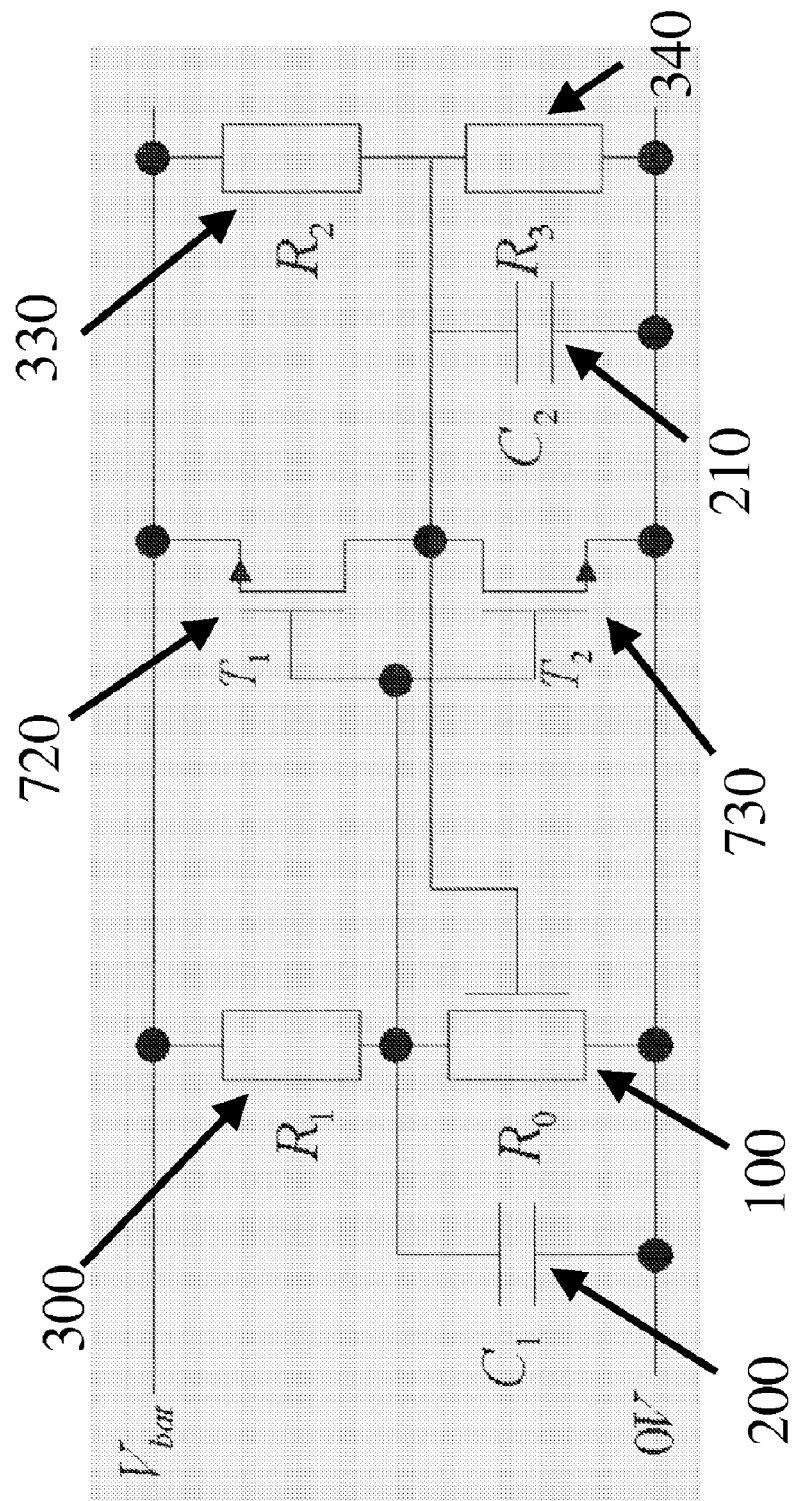
FIG. 13a shows a circuit diagram of an eighth embodiment according to the current invention with a piezoresistive resonator, two transistors, capacitors and resistors.
Figure 13B:
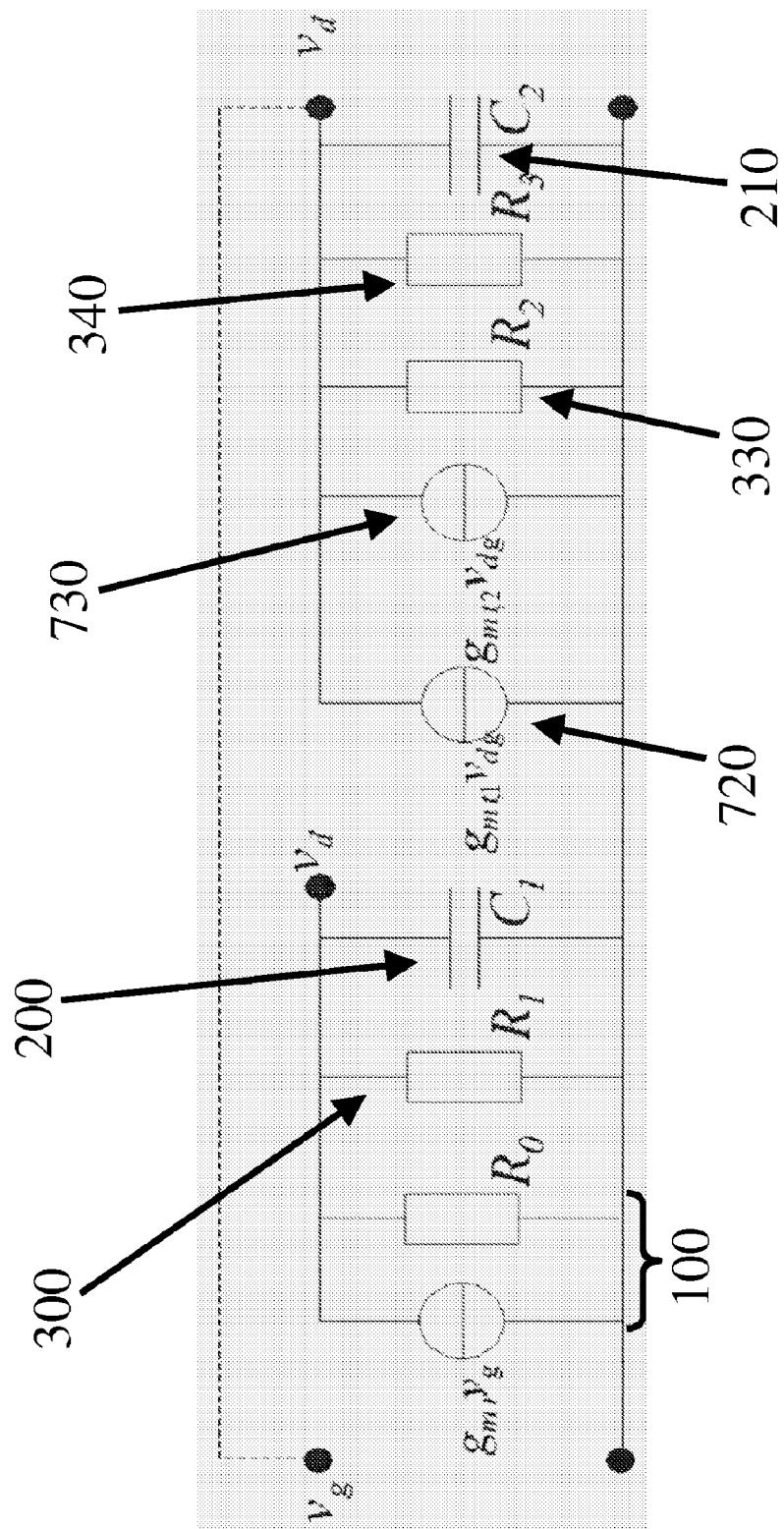
FIG. 13b shows the equivalent small-signal circuit of the circuit diagram depicted in FIG. 13a without biasing lines.

FIG. 13a shows an eight embodiment of the current invention and FIG. 13b the small signal circuit of the eight embodiment at resonance frequency with the input voltage $v_g$ and the output voltage $v_d$. The circuit diagram depicted in FIG. 13a shows a piezoresistive resonator 100, which is biased by a resistor 300. The output of the piezoresistive resonator 100 is fed to the gate of a n-MOS transistor 720 and a p-MOS transistor 730 and both gates are electrically connected. The drain of the n-MOS transistor 720 and a p-MOS transistor 730 are connected with each other and the output at the connection is fed back to the input of the piezoresistive resonator 100. A capacitor 200 is switched in parallel to the piezoresistive resonator 100. A capacitor 210 is switched parallel to the p-MOS transistor 730. A resistor 340 is switched parallel to capacitor 210 and p-MOS transistor 730, whereby resistor 330 being electrically connected with resistor 340 is switched parallel to n-MOS transistor 720. From the small signal circuit at resonance frequency depicted in FIG. 13b the loop gain can be derived in a similar way as described in description to FIG. 12b above resulting in (37), $$G(\omega_0) = (g_{mt1} + g_{mt2}) \frac{R_2 R_3}{R_2 + R_3} \frac{3}{4} V_{bat}^2 \frac{\varepsilon_0}{2\pi^2} \frac{K}{E} \frac{b}{tg^2} Q \qquad (37)$$

Oscillation occurs when $|G(w)| > 1$. Assuming $R_2 = R_3$, the gain condition becomes (38), $$(g_{mt1} + g_{mt2}) > \left( QR_2 V_{bat}^2 \frac{3\varepsilon_0}{16\pi^2} \frac{K}{E} \frac{b}{tg^2} \right)^{-1} \qquad (38)$$

Assuming the realistic values for Q, $V_{bat}$, $R_2$, K, E, b/t, and g, as depicted in Table 1 it follows that $g_{mt1} + g_{mt2} > 2.25$ mS.

TABLE 1

| Realistic values for Q, $V_{bat}$, $R_2$, K, E, b/t, and g | |
|---|---|
| E[Gpa] | 1.30E+11 |
| K | −153 |
| Q | 1.0E+05 |
| $V_{bat}$(V) | 3.0E+00 |
| g(m) | 2.0E−07 |
| t(m) | 4.0E−06 |
| b(m) | 2.0E−05 |
| b/t | 5.0E+00 |
| $R_2(\Omega)$ | 2.0E+04 |
| $g_{mt1} + g_{mt2} >$ [S] | 2.25E−03 |

Assuming that the p-MOS transistor 730 and n-MOS transistor 720 have the same transconductance $g_{mt1} = g_{mt2}$ and $g_{mt} = g_{mt1} + g_{mt2}$, it follows that the saturation current $I_{d,sat}$ through the p-MOS transistor 730 and n-MOS transistor 720 is given by (39), $$I_{d,sat} = g_{mt} \frac{V_{g0} - V_T}{2} \qquad (39)$$

When $R_0 = R_1$ than $V_{g0} = V_{bat}/2$, and assuming a threshold voltage $V_T = 0.8$V, than $I_{d,sat} = 0.4$ mA. The power consumed by the transistors is therefore $V_{bat} I_{d,sat} = 0.3$ mW. The additional power consumed by $R_0$, $R_1$, $R_2$, and $R_3$ equals (40), $$P_{diss} = V_{bat}^2 \left( \frac{1}{R_0 + R_1} + \frac{1}{R_2 + R_3} \right) \qquad (40)$$

Assuming $R_0 = R_1 = R_2 = R_3 = 20$ kOhm the total power consumption adds to 0.75 mW, which is compliant with specifications that are used for quartz oscillators.

The capacitances $C_1$ and $C_2$ are calculated from (30) and equal to 1.6 pF, this is a value that can easily be integrated on-chip and allows for connections to a buffer amplifier.

Figure 14A:
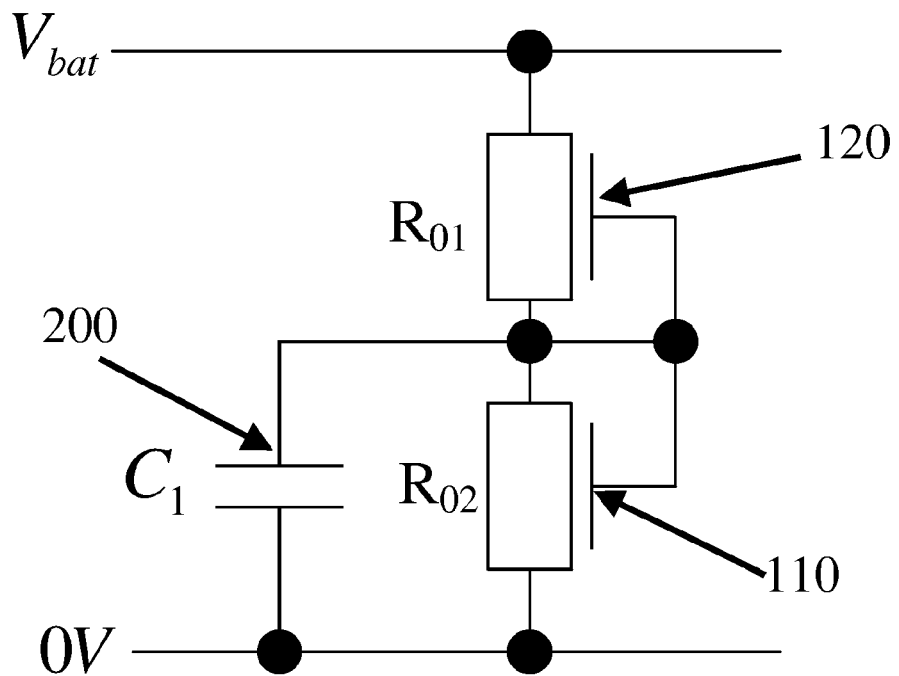
FIG. 14a shows a circuit diagram of a ninth embodiment according to the current invention with two piezoresistive resonators and a capacitor.
Figure 14B:
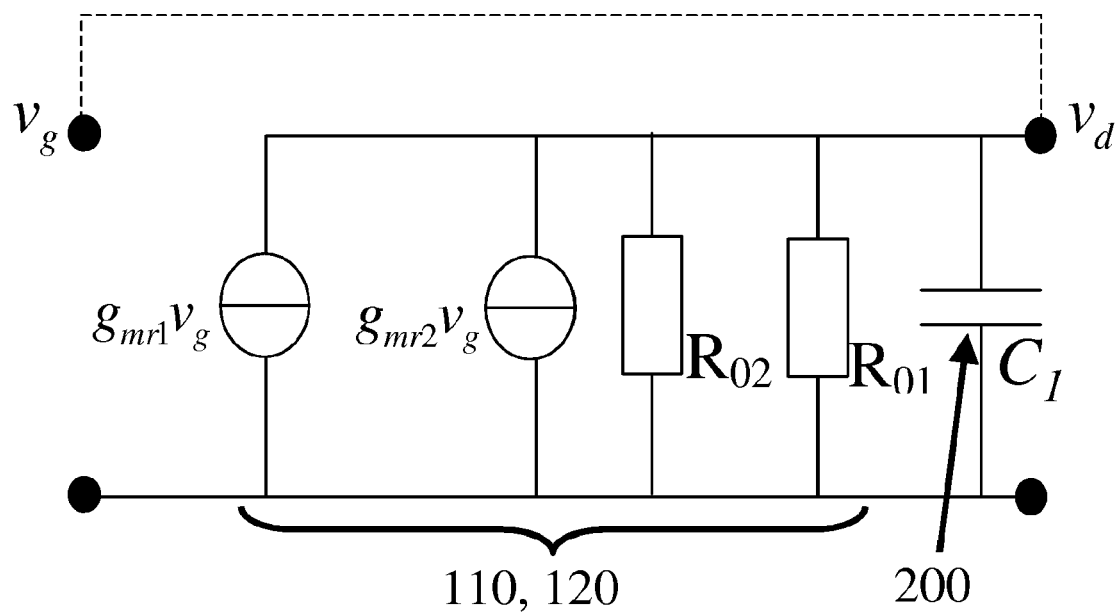
FIG. 14b shows the equivalent small-signal circuit of the circuit diagram depicted in FIG. 14a without biasing lines.

FIG. 14a shows a ninth embodiment of the current invention and FIG. 14b the small signal circuit of the ninth embodiment of the current invention at resonance frequency with the input voltage $v_g$ and the output voltage $v_d$. In FIG. 14a a series configuration of a p-type piezoresistive resonator 110 and a n-type piezoresistive resonator 120 is shown, whereby p-type piezoresistive resonator 110 of the series configuration is connected to ground and the n-type piezoresistive resonator 120 is connected to a voltage source e.g. a battery providing a voltage $V_{bat}$. A capacitor 200 is switched in parallel to the p-type piezoresistive resonator 110 and is at one side connected with ground and the other side connected to the interconnection between the p-type piezoresistive resonator 110 and the n-type piezoresistive resonator 120. Further the input of p-type piezoresistive resonator 110 and the n-type piezoresistive resonator 120 are fed back via a connection to the interconnection between the p-type piezoresistive resonator 110 and the n-type piezoresistive resonator 120. The configuration is similar to the first embodiment of the current invention shown in FIG. 3a. The fixed resistor 300 has been replaced by the n-type piezoresistive resonator 120. From the small signal circuit at resonance frequency given by FIG. 14b it can be derived that the loop gain condition now translates into (41), $$Q(g_{mr0,1} + g_{mr0,2})R_{tot} > 2 \quad (41)$$

$$R_{tot} = \frac{R_{02}R_{01}}{R_{02} + R_{01}}$$

with $g_{mr0,1}$ the transconductance of the n-type piezoresistive resonator 120 with a resistance $R_{01}$ if no voltage is applied to the n-type piezoresistive resonator 120 and $g_{mr0,2}$ the transconductance of the p-type piezoresistive resonator 110 with a resistance $R_{02}$ if no voltage is applied to the n-type piezoresistive resonator 110. In comparison to (7) with only one piezoresistive resonator 100 the loop gain is essentially doubled. Together with (1) this translates into (42), $$Q\frac{\varepsilon_0}{2}\left(\frac{K_n}{E_n} - \frac{K_p}{E_p}\right)\frac{b}{tg^2}I_d V_{gap} R_{tot} > 2 \quad (42)$$

whereby $K_n$ is the piezoresistive gauge factor of the n-type piezoresistive resonator 120 and $E_n$ the corresponding Youngs modulus and $K_p$ is the piezoresistive gauge factor of the p-type piezoresistive resonator 110 and $E_p$ the corresponding Youngs modulus. With $$I_d = \frac{V_{bat}}{R_{01} + R_{02}},$$

(29) results into (43), $$Q\frac{\varepsilon_0}{2}\left(\frac{K_n}{E_n} - \frac{K_p}{E_p}\right)\frac{b}{tg^2}\frac{R_{01}R_{02}}{(R_{01}+R_{02})^2}V_{bat}V_{gap} > 2 \quad (43)$$

the loop gain is maximum when $R_{01} = R_{02}$. Examples for $K_n$, $K_p$, $E_n$ and $E_p$ are given in table 2.

TABLE 2

Resonators with n-type dopant have an opposite K compared to resonators which are doped p-type

| dope | crystal orientation | E(Pa) | K *) | K/E(Pa^-1) |
|---|---|---|---|---|
| n | [100] | 1.30E+11 | −151 | −1.18E−09 |
| n | [110] | 1.69E+11 | −89 | −5.27E−10 |
| n | [111] | 1.88E+11 | −13 | −6.91E−11 |
| p | [100] | 1.30E+11 | 5 | 3.85E−11 |
| p | [110] | 1.69E+11 | 121 | 7.16E−10 |
| p | [111] | 1.88E+11 | 173 | 9.2E−10 |

*) for 1 Ohm·cm

In order to illustrate the practical realization of such an oscillator the following numerical example is given using realistic values for the different parameters. Assuming $K_n/E_n - K_p/E_p = 1.2$ e−9 Pa$^{-1}$ (p-type and p-type piezoresistive resonator 110, 120 aligned parallel to the [100] or [110] direction, see table 2), Q=100000, g=200 nm, and $V_{bat}$=3.5V, it follows from (10) that (44), $$\frac{b}{t}V_{gap} > 170 \quad (44)$$

with $V_{gap}$=10V it follows that b/t<17.

Assuming $C_1$=1 pF and $f_0$=10 MHz it follows from (5) that $R_{01} = R_{02} = 32$ kOhm and dissipated power is given by (45), $$P_{diss} = \frac{V_{bat}^2}{R_{01} + R_{02}} \quad (45)$$

and equals only 0.2 mW, which is compliant with specifications that are used for quartz oscillators.

Figure 10:
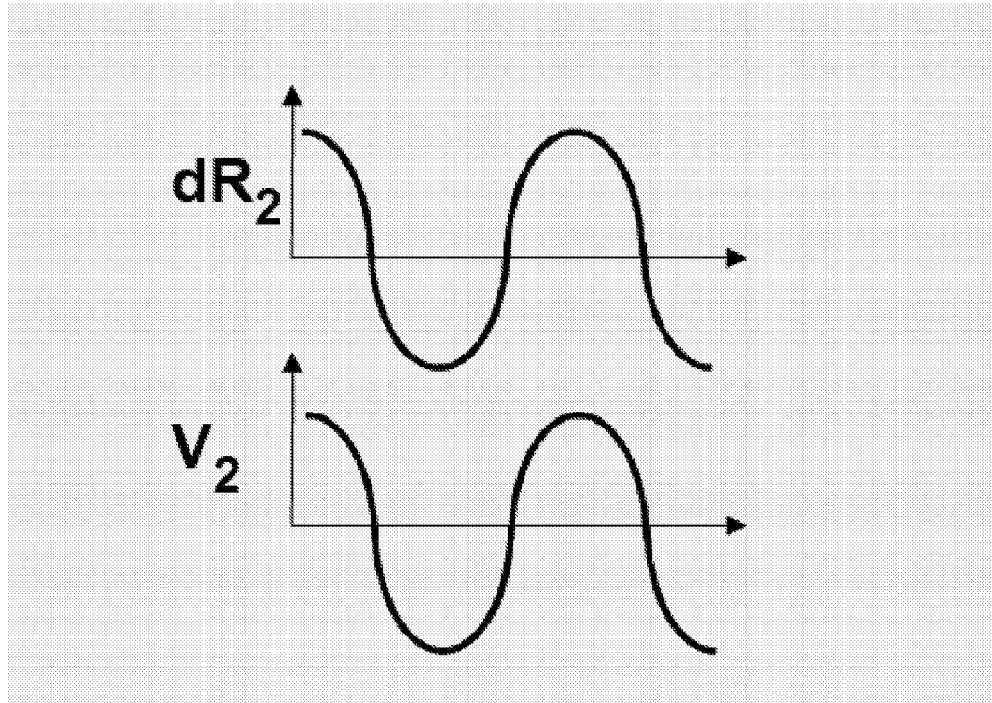
Figure 15A:
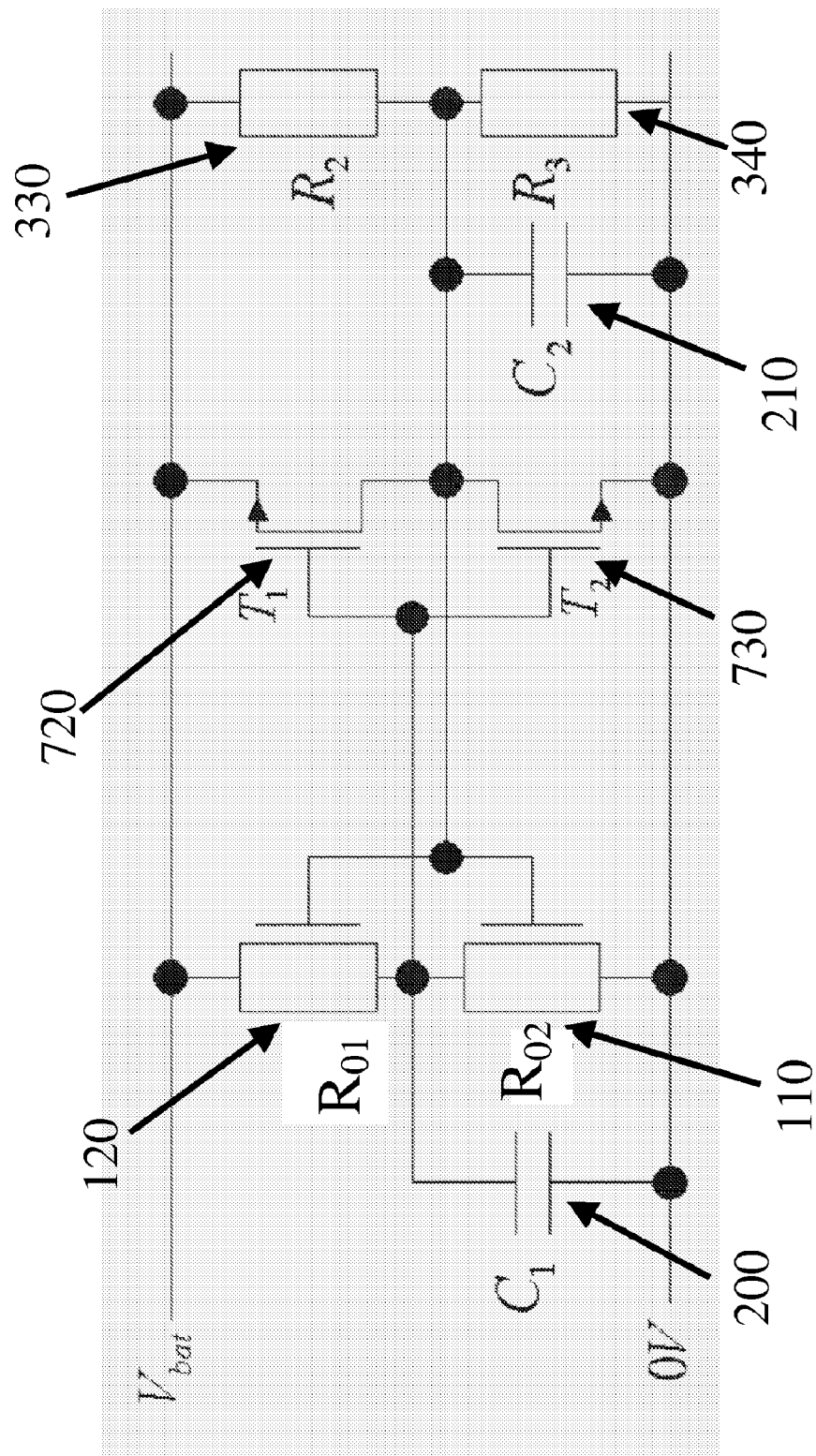
FIG. 15a shows a circuit diagram of a tenth embodiment according to the current invention with two piezoresistive resonators, two transistors, capacitors and resistors.
Figure 15B:
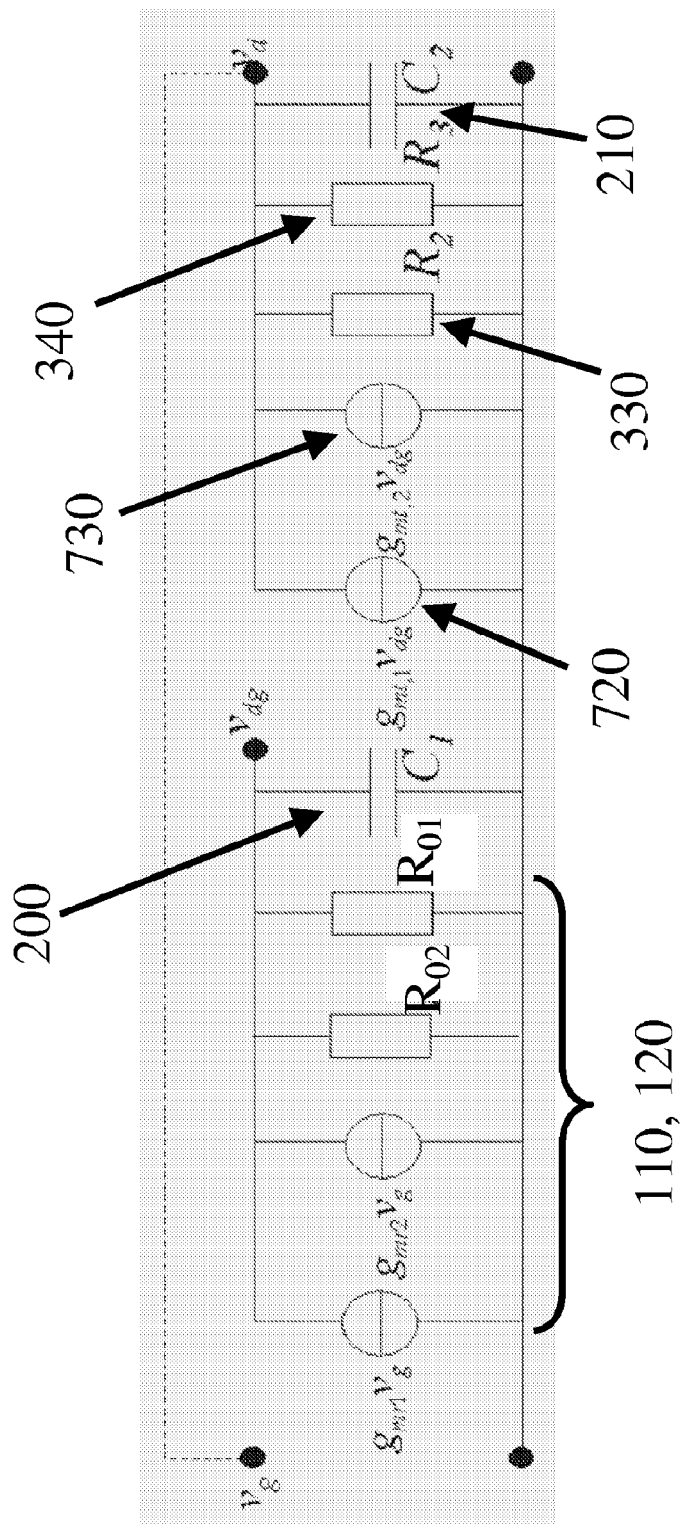
FIG. 15b shows the equivalent small-signal circuit of the circuit diagram depicted in FIG. 15a without biasing lines.

FIG. 15a shows a tenth embodiment of the current invention and FIG. 15b the small signal circuit of the tenth embodiment at resonance frequency with the input voltage $v_g$ and the output voltage $v_d$. The circuit diagram depicted in FIG. 15a shows a series configuration of a p-type piezoresistive resonator 110 and a n-type piezoresistive resonator 120, whereby p-type piezoresistive resonator 110 of the series configuration is connected to ground and the n-type piezoresistive resonator 120 is connected to a voltage source e.g. a battery providing a voltage $V_{bat}$. The interconnection between the p-type piezoresistive resonator 110 and the n-type piezoresistive resonator 120 is further connected to the gate of a n-MOS transistor 720 and a p-MOS transistor 730 and both gates are electrically connected. The drain of the n-MOS transistor 720 and the p-MOS transistor 730 are connected with each other and the signal output at the connection is fed back to the input of the p-type piezoresistive resonator 110 and the n-type piezoresistive resonator 120 and both inputs are electrically connected. A capacitor 200 is switched in parallel to the piezoresistive resonator 110. A capacitor 210 is switched parallel to the p-MOS transistor 730. A resistor 340 is switched parallel to capacitor 210 and p-MOS transistor 730, whereby resistor 330 being electrically connected with resistor 340 and resistor 340 is switched parallel to n-MOS transistor 720. The circuit configuration is essentially the same as the circuit configuration shown in FIG. 13a. The n-type piezoresistive resonator 120 has replaced the fixed capacitor 300 and the piezoresistive resonator 100 of FIG. 10a has been specified to be a p-type piezoresistive resonator 110. From the small signal circuit at resonance frequency depicted in FIG. 15b the loop gain can be derived in a similar way as described in description to FIG. 13b above resulting in (46), $$G(\omega_0) = -(g_{mt1} + g_{mt1})(g_{mr01} + g_{mr02})R_{tot1}R_{tot2}QQ1 \quad (46)$$

$$R_{tot2} = \frac{R_2 R_3}{R_2 + R_3}$$

$$R_{tot1} = \frac{R_{01} R_{02}}{R_{01} + R_{02}}$$

Taking essentially the same conditions as described in connection with FIG. 12a and FIG. 12b given by (47), $$C_1 R_{tot1} = C_2 R_{tot2}$$

$$R_{01} = R_{02} = R_2 = R_3 \quad (47)$$

results in (48), $$(g_{mt1} + g_{mt2}) > \left(QR_2 V_{bat}^2 \frac{3\varepsilon_0}{16\pi^2}\left(\frac{K_n}{E_n} + \frac{K_p}{E_p}\right)\frac{b}{tg^2}\right)^{-1} \quad (48)$$

essentially doubling the loop gain.

Assuming that the n-type and p-type piezoresistive resonator have the same transconductance $g_{mr01}=g_{mr02}$, and assuming that the p-MOST and n-MOST have a transconductance $g_{mt1}+g_{mt2}=g_{mt}$, and assuming $R_{01}=R_{02}=R_2=R_3=20$ kOhm, and using all other parameters from Table 1 and Table 2, than it follows that $g_{mt}>0.6$ mS. The $I_{d,sat}$ is now 0.2 mA, and power consumption of the transistors is 0.15 mW. The total power consumption is now 0.15+0.45=0.6 mW. In practice the power consumption of the transistors will be about twice as large, since a loop gain of about 2 is normally used in oscillator design. In that case the total power consumption is only 0.75 mW.

The capacitance values $C_1$ and $C_2$ are 1.6 pF and can be easily integrated

Figure 16:
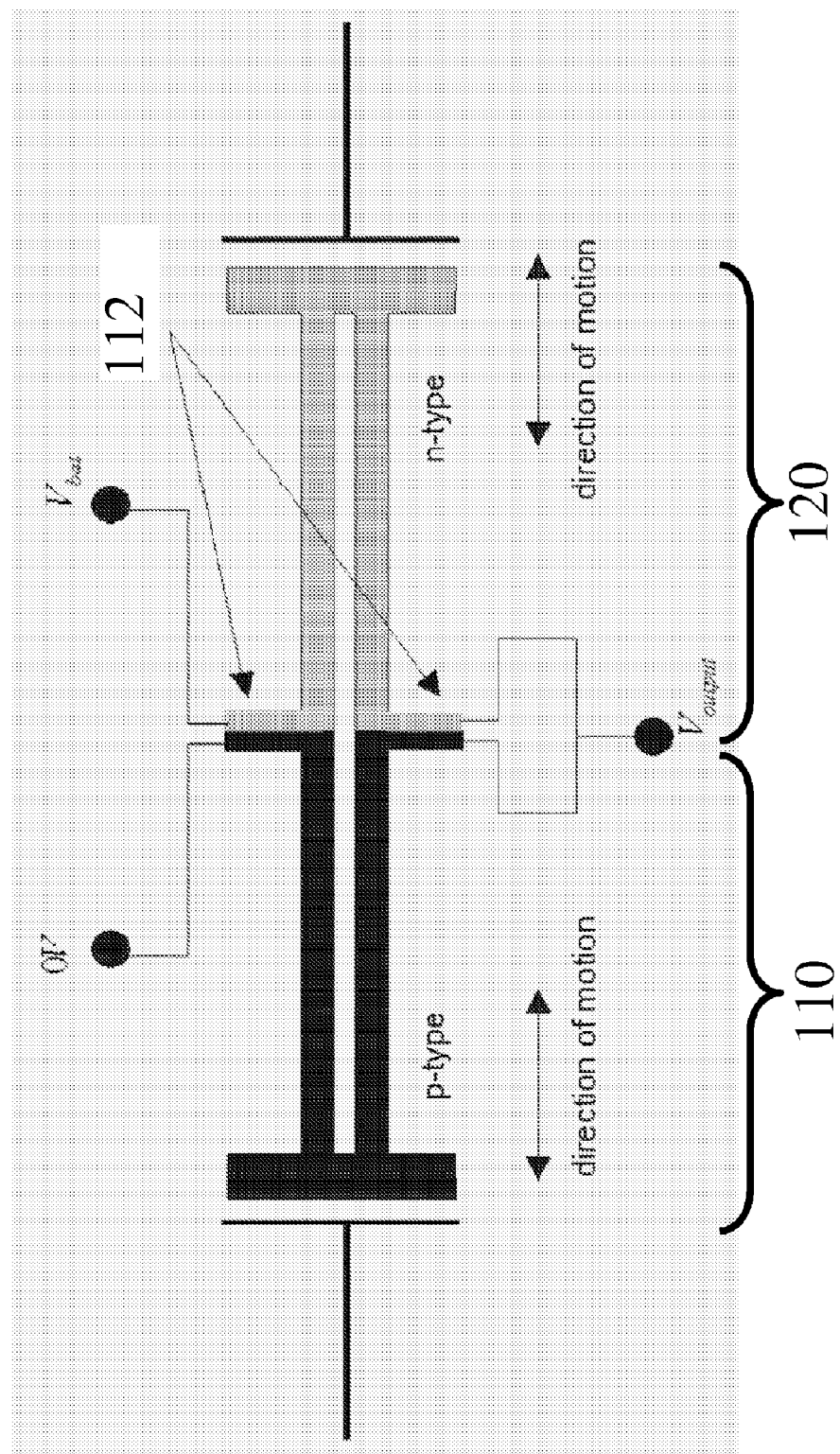
FIG. 16 shows a piezoresistive resonator integrating p-type and n-type piezoresistive resonator into a single resonating body.

It is important that the p-type and n-type piezoresistive resonator are perfectly matched and have exactly the same resonance frequency. This can be accomplished by using a resonator that integrates both types into a single resonating body. An example of how this can be accomplished is depicted in FIG. 16. The left and right arms are part of the same resonating body, the anchor 112 is at the node of the resonance mode. The left arm is a p-type piezoresistive resonator 120 and the right arm is a n-type piezoresistive resonator 110. The p-type piezoresistive resonator 120 and the n-type piezoresistive resonator 110 are electrically isolated from each other at there physical boundary at the node of the resonance mode. The p-type piezoresistive resonator 120 and the n-type piezoresistive resonator 110 are switched in series by external (with respect to the resonating body) electrical connections (wiring, conductive tracks). The integrated n-type piezoresistive resonator 110 and p-type piezoresistive resonator 120 can be processed within one process flow.

The present invention is described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, first, second and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The invention claimed is:

1. An oscillator circuit comprising:
a first piezoresistive resonator having first and second piezoresistive lines, each of which is attached to an anchor at a first end and to a resonator electrode at a second end, and an actuation electrode configured such that application of an input voltage between the resonator electrode and the actuation electrode causes a deformation of the first and second piezoresistive conductor lines, thereby changing the electrical resistance of the first and second piezoresistive conductor lines; and
a bias circuit for causing a current to flow through the first and second piezoresistive conductor lines and the resonator electrode, whereby the variation in electrical resistance of the first and second piezoresistive conductor lines is detectable as a corresponding change in an output voltage across the first and second piezoresistive conductor lines and resonator electrode; characterized in that the magnitude of the output voltage is greater than that of the input voltage and in that the output voltage is coupled back to the input voltage via a phase changing circuit comprising passive components only adapted to introduce a phase shift such that self-sustained oscillation is enabled.

2. An oscillator circuit according to claim 1, wherein the phase changing circuit comprises an inductor and a capacitor.

3. An oscillator circuit according to claim 2, wherein the capacitor is connected in parallel with a series combination of the inductor and the first piezoresistive resonator, the actuation electrode being coupled to the junction between the capacitor and the inductor.

4. An oscillator circuit according to claim 2, wherein the inductor is connected in parallel with a series combination of the capacitor and the first piezoresistive resonator, the actuation electrode being coupled to the junction between the capacitor and the inductor.

5. An oscillator circuit according to claim 2, wherein the phase changing circuit comprises a ladder network of capacitors and inductors, in which a first plurality of circuits comprising an inductor and a capacitor in parallel are connected in series across the first piezoresistive resonator and a second plurality of circuits comprising an inductor and a capacitor in parallel are connected from the junction between each adjacent pair of the first plurality of circuits and ground, the actuation electrode being coupled to the junction between the circuits in the first and second pluralities of circuits that are furthest removed from the first piezoresistive resonator.

6. An oscillator circuit according to claim 1, wherein the phase changing circuit comprises a step-up transformer having a primary and a secondary, the primary being connected in parallel with the piezoresistive resonator and the secondary being coupled to the actuation electrode.

7. An oscillator circuit according to claim 1, wherein the phase changing circuit comprises a second piezoresistive resonator, the output voltage of the first piezoresistive resonator being coupled to the input voltage of the second piezoresistive resonator and the output voltage of the second piezoresistive resonator being coupled to the input voltage of the first piezoresistive resonator.

8. An oscillator circuit according to claim 7, wherein the first and second piezoresistive resonators are each connected in series with respective resistors.

9. An oscillator circuit according to claim 7, wherein the first and second piezoresistive resonators are each connected in series with the respective inductors.

10. An integrated oscillator comprising an oscillator circuit according to claim 1.

* * * * *